United States Patent
Gu et al.

(10) Patent No.: US 12,363,887 B2
(45) Date of Patent: Jul. 15, 2025

(54) SEMICONDUCTOR DEVICE INCLUDING CONTACT PLUG

(71) Applicant: SAMSUNG ELECTRONICS CO., LTD., Suwon-si (KR)

(72) Inventors: Bonhong Gu, Daegu (KR); Minwoo Kim, Seoul (KR); Jinyong Kim, Hwaseong-si (KR); Hyodong Ban, Suwon-si (KR); Jungwoo Song, Hwaseong-si (KR); Daegwon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 474 days.

(21) Appl. No.: 17/961,635

(22) Filed: Oct. 7, 2022

(65) Prior Publication Data
US 2023/0113319 A1   Apr. 13, 2023

(30) Foreign Application Priority Data
Oct. 12, 2021   (KR) .......... 10-2021-0134872

(51) Int. Cl.
    *H10B 12/00*   (2023.01)
(52) U.S. Cl.
    CPC .......... *H10B 12/315* (2023.02); *H10B 12/50* (2023.02)
(58) Field of Classification Search
    CPC .............................. H10B 12/315; H10B 12/50
    See application file for complete search history.

(56) References Cited

U.S. PATENT DOCUMENTS

| | | | |
|---|---|---|---|
| 6,022,776 A | 2/2000 | Lien et al. | |
| 7,087,519 B2 | 8/2006 | Park | |
| 8,563,426 B2 | 10/2013 | Chumakov et al. | |
| 10,249,627 B2 | 4/2019 | Han et al. | |
| 10,522,468 B2 | 12/2019 | Ho et al. | |
| 10,825,766 B2 | 11/2020 | Kim et al. | |
| 2022/0148965 A1* | 5/2022 | Lee | H01L 21/76877 |
| 2022/0262721 A1* | 8/2022 | Choi | H01L 23/5226 |
| 2023/0109983 A1* | 4/2023 | Lee | H10B 12/50 |
| | | | 257/296 |

FOREIGN PATENT DOCUMENTS

| | | |
|---|---|---|
| JP | 2000-031276 A | 1/2000 |
| KR | 10-1998-040667 A | 8/1998 |
| KR | 10-2005-0114147 A | 12/2005 |
| KR | 10-2006-0022995 A | 3/2006 |
| KR | 10-0877095 B1 | 1/2009 |

* cited by examiner

*Primary Examiner* — Richard A Booth
(74) *Attorney, Agent, or Firm* — Muir Patent Law, PLLC

(57) ABSTRACT

A semiconductor device includes conductive patterns, an insulating pattern between the conductive patterns, an insulating etch stop layer on the conductive patterns and the insulating pattern, a capacitor including first electrodes in contact with the first conductive patterns, a second capacitor electrode, and a dielectric between the first and second capacitor electrodes, an insulating structure covering the capacitor and the insulating etch stop layer, and a peripheral contact plug through the insulating structure and the insulating etch stop layer and including first through fifth plug regions stacked on top of each other, at least a portion of a side surface of the fourth plug region having an inclination angle different from inclinations angles of the third and fifth plug regions, and a vertical thickness of the fifth plug region being at least twice as great as a sum of vertical thicknesses of the first to fourth plug regions.

20 Claims, 17 Drawing Sheets

SEMICONDUCTOR DEVICE INCLUDING CONTACT PLUG

CROSS-REFERENCE TO RELATED APPLICATION

This application claims the benefit under 35 USC 119(a) of Korean Patent Application No. 10-2021-0134872, filed on Oct. 12, 2021, in the Korean Intellectual Property Office, the entire disclosure of which is incorporated herein by reference for all purposes.

BACKGROUND

1. Field

Embodiments relate to a semiconductor device including a contact plug and a method of manufacturing the same.

2. Description of the Related Art

Research into reduction in the size of elements constituting a semiconductor device and improvement of performance thereof is being conducted. For example, in a dynamic random-access memory (DRAM) device, research is being conducted to reliably and stably form elements having reduced sizes.

SUMMARY

According to example embodiments, a semiconductor device may include a lower structure having a first area and a second area; conductive patterns including first conductive patterns disposed on the first area of the lower structure and a second conductive pattern disposed on the second area of the lower structure; an insulating pattern disposed between the conductive patterns; an insulating etch stop layer on the conductive patterns and the insulating pattern; a capacitor disposed on the first area, and including first capacitor electrodes in contact with the first conductive patterns and extending upwardly while penetrating through the insulating etch stop layer, a second capacitor electrode disposed on the first capacitor electrodes, and a capacitor dielectric between the first capacitor electrodes and the second capacitor electrode; an insulating structure covering the capacitor, on the first area, and covering the insulating etch stop layer, on the second area; and a peripheral contact plug disposed on the second area, penetrating through the insulating structure and the insulating etch stop layer, and contacting the second conductive pattern. The peripheral contact plug includes a first plug region in contact with the second conductive pattern and extending into the second conductive pattern, a second plug region penetrating through the insulating etch stop layer, on the first plug region, a third plug region including a first side surface, on the second plug region, a fourth plug region including a second side surface, on the third plug region, and a fifth plug region including a third side surface, on the fourth plug region. The first side surface adjacent to the fourth plug region has a first inclination, the third side surface adjacent to the fourth plug region has a second inclination, at least a portion of the second side surface has an inclination different from the first and second inclinations, and a vertical thickness of the fifth plug region is at least twice as great as a sum of vertical thicknesses of the first to fourth plug regions.

According to example embodiments, a semiconductor device may include a lower structure including a transistor; a conductive pattern disposed on the lower structure; an insulating pattern covering a side surface of the conductive pattern; an insulating etch stop layer on the conductive pattern and the insulating pattern; an insulating structure on the insulating etch stop layer; and a contact plug penetrating through the insulating structure and the insulating etch stop layer and contacting the conductive pattern. The contact plug includes a first plug region in contact with the conductive pattern, a second plug region penetrating through the insulating etch stop layer, on the first plug region, a third plug region including a first side surface, on the second plug region, a fourth plug region including a second side surface, on the third plug region, and a fifth plug region including a third side surface, on the fourth plug region. The fourth plug region includes a lower region increasing in width in an upper direction and an upper region decreasing in width in the upper direction, on the lower region, the upper direction is a direction from the lower region toward the upper region, and a vertical thickness of the fifth plug region is at least twice as great as a sum of vertical thicknesses of the first to fourth plug regions.

According to example embodiments, a semiconductor device may include a lower structure including a transistor; a conductive pattern on the lower structure; an insulating pattern covering a side surface of the conductive pattern; an insulating etch stop layer on the conductive pattern and the insulating pattern; an insulating structure on the insulating etch stop layer; and a contact plug penetrating through the insulating structure and the insulating etch stop layer and contacting the conductive pattern. The contact plug includes a first plug region in contact with the conductive pattern, a second plug region penetrating through the insulating etch stop layer, on the first plug region, a third plug region including a first side surface, on the second plug region, a fourth plug region including a second side surface, on the third plug region, and a fifth plug region including a third side surface, on the fourth plug region. A vertical thickness of the fifth plug region is at least twice as great as a sum of vertical thicknesses of the first to fourth plug regions, the first side surface of the third plug region adjacent to the fourth plug region has a first inclination, the third side surface of the fifth plug region adjacent to the fourth plug region has a second inclination, and at least a portion of the second side surface of the fourth plug region has an inclination different from the first and second inclinations.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
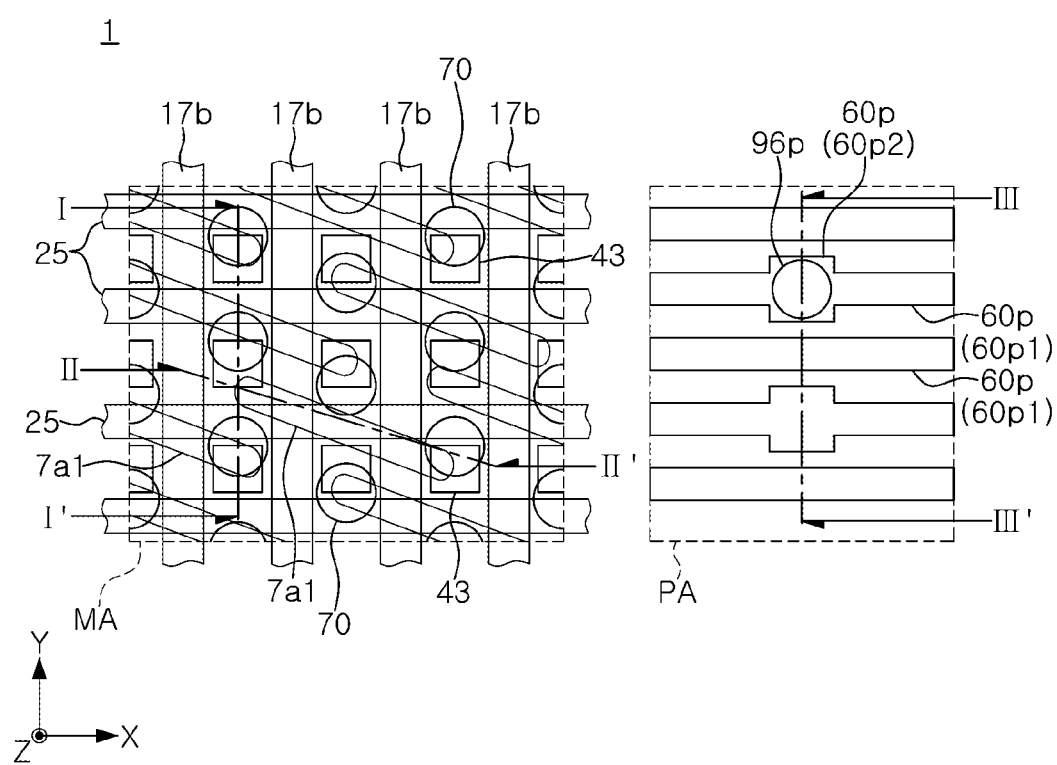
FIGS. 1, 2A, 2B, and 3 are diagrams illustrating a semiconductor device according to an example embodiment.
Figure 2A:
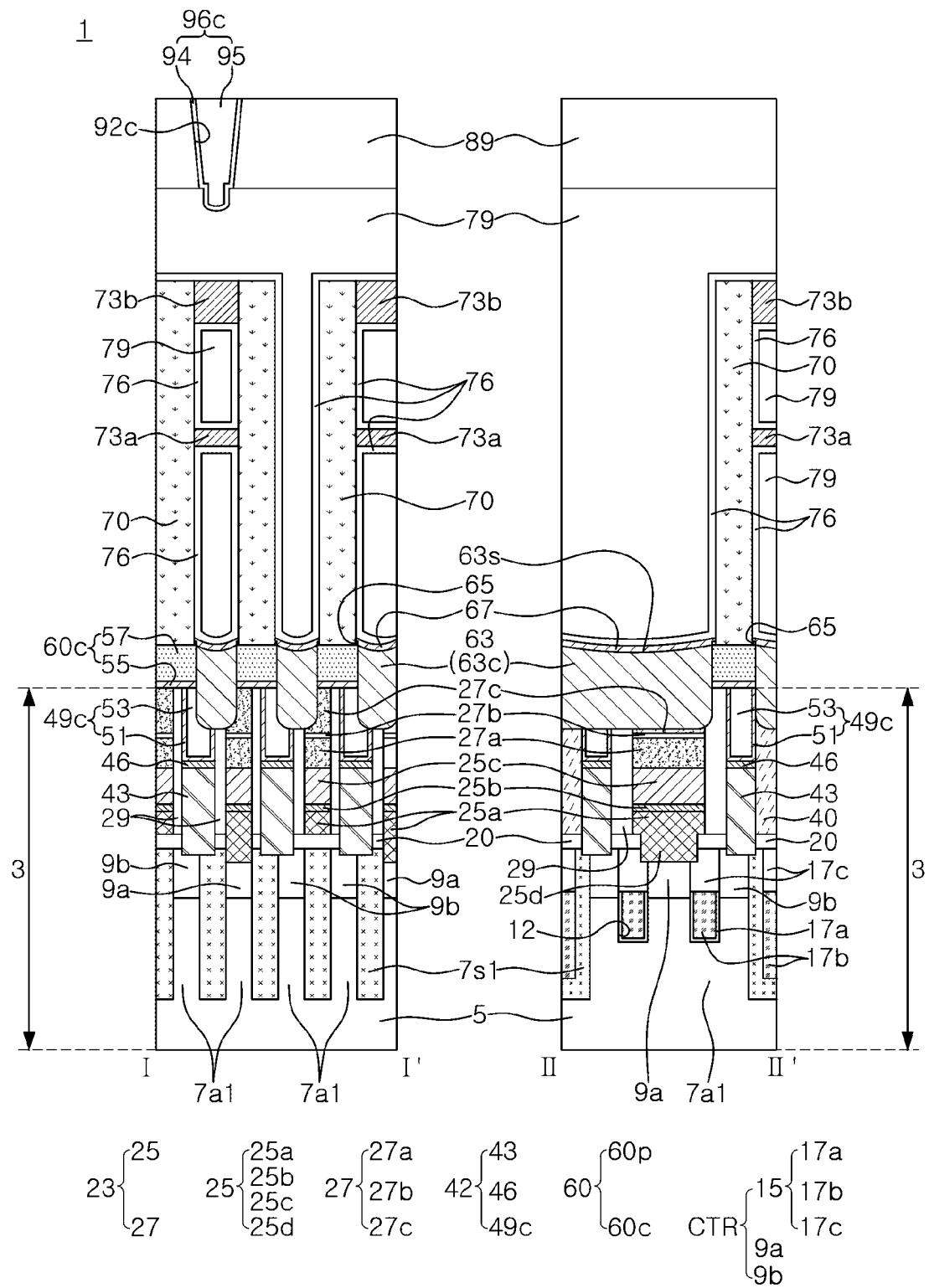
Figure 2B:
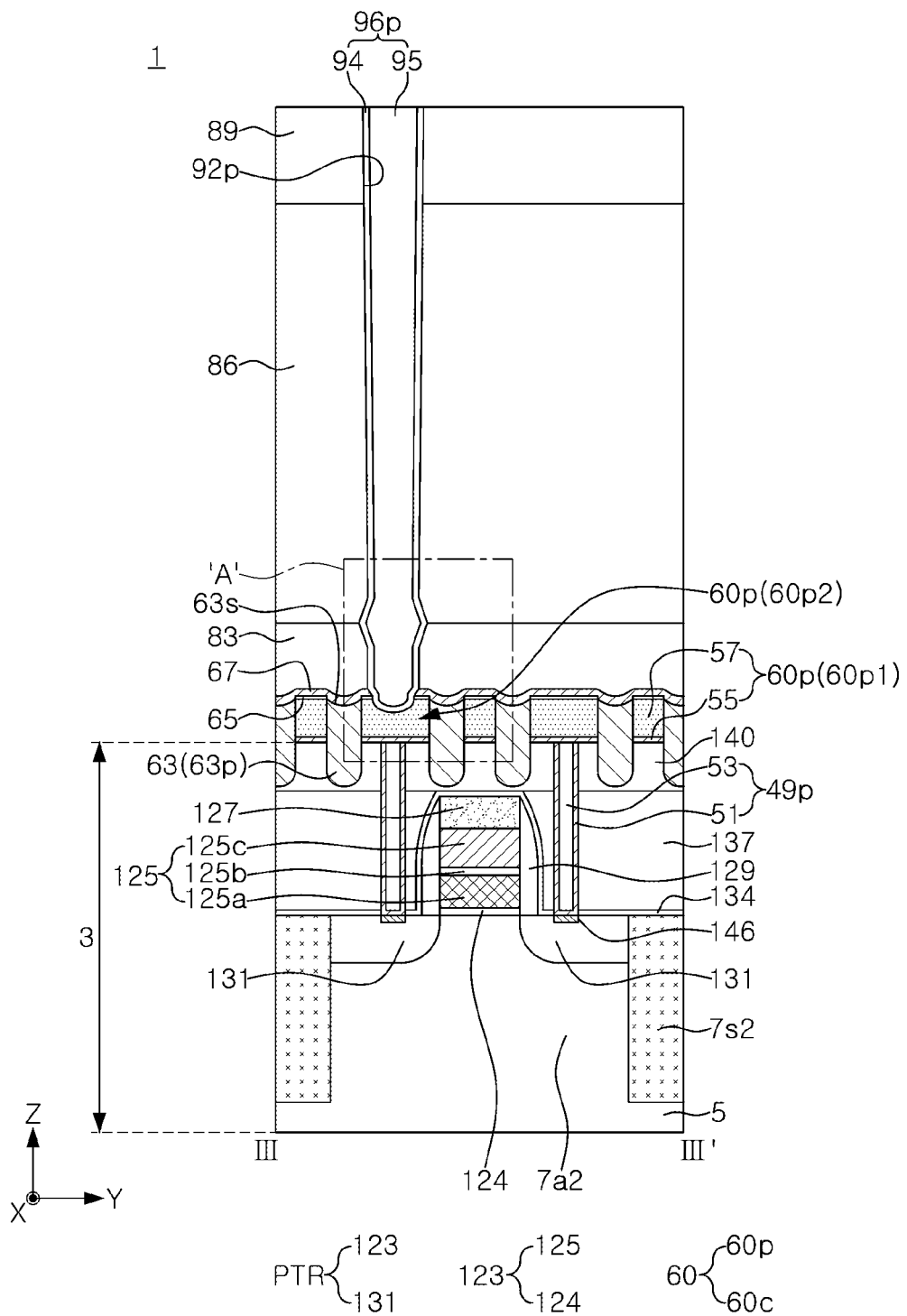

FIGS. 1, 2A, 2B and 3A illustrate a semiconductor device according to an example embodiment. FIG. 1 is a plan view illustrating a semiconductor device according to an example embodiment, FIG. 2A is a cross-sectional view along lines I-I' and II-II' of FIG. 1, FIG. 2B is a cross-sectional view along line of FIG. 1, and FIG. 3 is a partially enlarged view of region 'A' of FIG. 2B.

Figure 3:
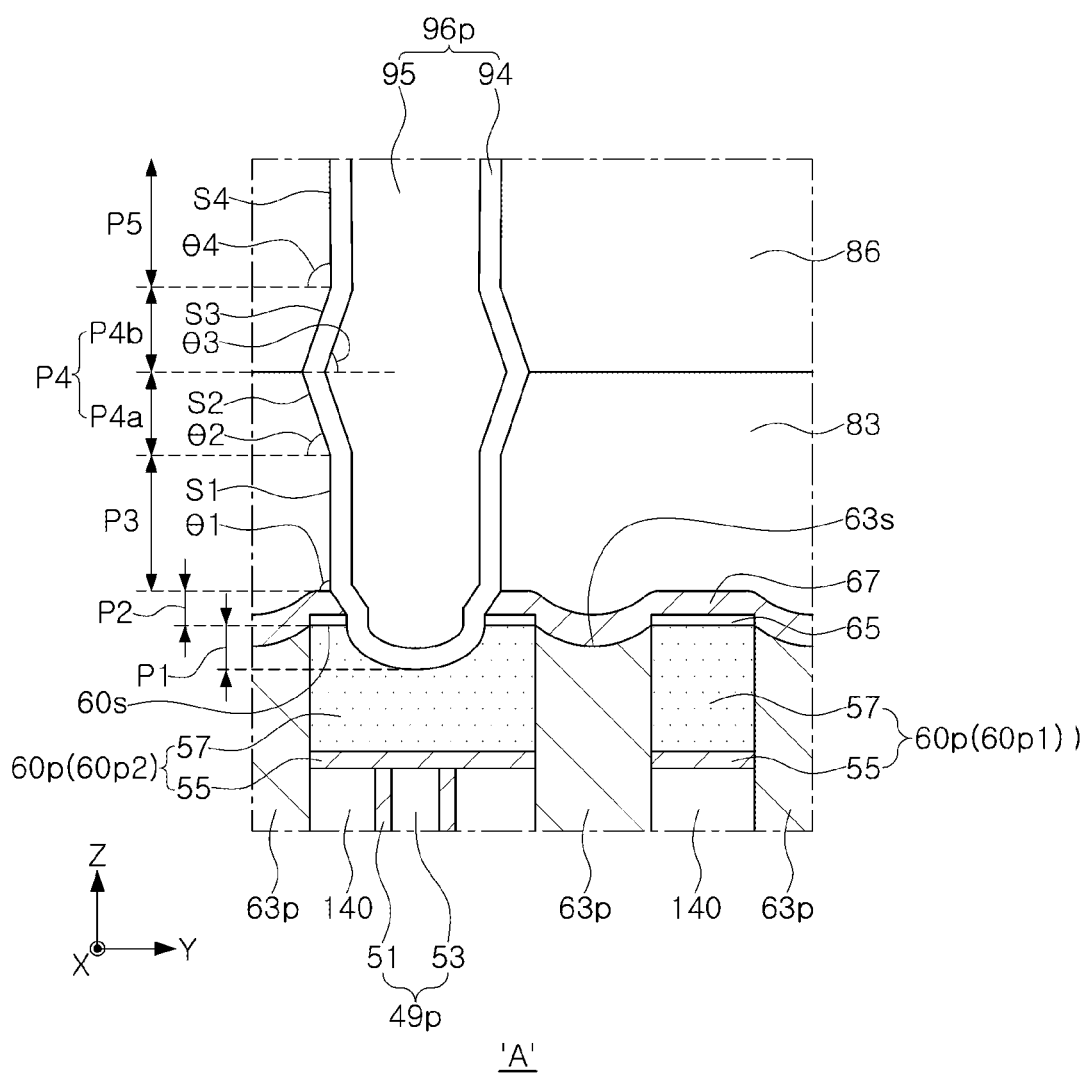

Referring to FIGS. 1 to 3, a semiconductor device 1 according to an example embodiment may include a lower structure 3 having a first area MA and a second area PA, conductive patterns 60 including first conductive patterns 60c and a second conductive pattern 60p, on the lower structure 3, an insulating pattern 63 covering side surfaces of the conductive patterns 60, an insulating etch stop layer 67 on the conductive patterns 60 and the insulating pattern 63, a capacitor (70, 76, 79) on the first area MA, a capacitor contact plug 96c on the capacitor (70, 76, 79), and a peripheral contact plug 96p on the second area PA. The first area MA may be a memory cell area, and the second area PA may be a peripheral area or a peripheral circuit area.

The lower structure 3 may include a semiconductor substrate 5, first active regions 7a1 disposed on the semiconductor substrate 5 in the first area MA, second active regions 7a2 disposed on the semiconductor substrate 5 in the second area PA, a first isolation region 7s1 on side surfaces of the first active regions 7a1, and a second isolation region 7s2 on side surfaces of the second active regions 7a2.

Hereinafter, for convenience of description, one first active region 7a1 and one second active region 7a2 will be mainly described. Also, in the following, although one element is mainly described, it may be understood that one element may be disposed in plural.

The lower structure 3 may include one or a plurality of gate trenches 12 traversing the first active region 7a1 in the first area MA and extending to the first isolation region 7s1, first gate structures 15 disposed within the gate trenches 12, and a first impurity region 9a and a second impurity region 9b disposed in the first active region 7a1 adjacent to side surfaces of the first gate structures 15. Each of the first gate structures 15 may include a first gate electrode 17b, a first gate dielectric 17a disposed between the first gate electrode 17b and the first active region 7a1, and a first gate capping layer 17c on the first gate electrode 17b. The first gate electrode 17b may be formed of a conductive material, and the gate capping layer 17c may be formed of an insulating material. For example, the first gate electrode 17b may include doped polysilicon, a metal, conductive metal nitride, conductive metal silicide, conductive metal oxide, graphene, carbon nanotube, or combinations thereof. For example, the first gate electrode 17b may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotube, or combinations thereof. The first gate electrode 17b may include a single layer or multiple layers of the aforementioned materials.

Any one of the first gate structures 15 and the first and second impurity regions 9a and 9b disposed on both sides of the first gate structure 15 may constitute a first transistor CTR. In this case, the first and second impurity regions 9a and 9b may be first source/drain regions.

The lower structure 3 may further include a second gate structure 123 disposed on the second active area 7a2 in the second area PA, a peripheral gate capping layer 127 on the second gate structure 123, and second source/drain regions 131 disposed in the second active region 7a2 on both sides of the second gate structure 123. The second gate structure 123 may include a second gate dielectric 124 and a second gate electrode 125 disposed on the second gate dielectric 124. The second gate electrode 125 may include a first electrode material layer 125a, a second electrode material layer 125b, and a third electrode material layer 125c sequentially stacked. For example, the first electrode material layer 125a may include doped silicon, e.g., polysilicon having N-type conductivity or polysilicon having P-type conductivity, the second electrode material layer 125b may include a metal-semiconductor compound, e.g., tungsten silicide, and the third electrode material layer 125c may include a metal, e.g., tungsten. The second gate electrode 125 and the second source/drain regions 131 may constitute a second transistor PTR. The peripheral gate capping layer 127 may be formed of an insulating material, e.g., silicon nitride.

The first active region 7a1 may be a cell active region, and the second active region 7a2 may be a peripheral active region. The first transistor CTR may be a cell transistor or a cell switching device, and the second transistor PTR may be a peripheral transistor or a peripheral circuit transistor. The first gate electrode 17b of the first transistor CTR may be a cell gate electrode or a word line, and the second gate electrode 125 of the second transistor PTR may be a peripheral gate electrode.

The lower structure 3 may further include a buffer insulating layer 20 formed on the first active region 7a1 and the first isolation region 7s1. The lower structure 3 may further include a bit line structure 23 and a first contact plug 42 in the first area MA. The bit line structure 23 may include a bit line 25 and a bit line capping layer 27 that are sequentially stacked. The bit line 25 may be formed of a conductive material. The bit line 25 may include a first bit line material layer 25a, a second bit line material layer 25b, and a third bit line material layer 25c sequentially stacked. For example, the first bit line material layer 25a may include doped silicon, e.g., polysilicon having an N-type conductivity, the second bit line material layer 25b may include a metal-semiconductor compound, e.g., tungsten silicide, and the third bit line material layer 25c may include a metal, e.g., tungsten. The bit line capping layer 27 may include a first bit line capping layer 27a, a second bit line capping layer 27b, and a third bit line capping layer 27c sequentially stacked. The bit line capping layer 27 may be formed of an insulating material. Each of the first to third bit line capping layers 27a, 27b, and 27c may be formed of silicon nitride or a silicon nitride-based insulating material.

The bit line 25 may further include a bit line contact portion 25d extending downwardly from the first bit line material layer 25a and electrically connected to the first impurity region 9a. The bit line 25 may be formed on the buffer insulating layer 20, and the bit line contact portion 25d of the bit line 25 may penetrate through the buffer insulating layer 20 and may be in contact with the first impurity region 9a.

The first contact plug 42 may include a lower contact plug 43 penetrating through the buffer insulating layer 20 and contacting the second impurity region 9b, an upper contact plug 49c on the lower contact plug 43, and a metal-semiconductor compound layer 46 between the lower contact plug 43 and the upper contact plug 49c. The contact plug 43 may include doped silicon, e.g., polysilicon having an N-type conductivity.

The lower structure 3 may further include a bit line spacer 29 that may be in contact with the side surfaces of the bit line structure 23 and may be formed of an insulating material, and a peripheral gate spacer 129 that may be in contact with the side surfaces of the peripheral gate structure 123 and may be formed of an insulating material.

The lower structure 3 may further include a partition insulating pattern 40 contacting the contact plug 43, between a pair of the bit line structures 23 adjacent and parallel to each other. For example, the contact plug 43 may be disposed in plural, between a pair of adjacent and parallel bit line structures 23, and the partition insulating pattern 40 may be disposed between the plurality of contact plugs 43.

The lower structure 3 may further include an insulating liner 134 covering the peripheral active region 7a2 and the second isolation region 7s2 and covering a surface of the peripheral gate spacer 129 and an upper surface of the peripheral gate structure 123, a first interlayer insulating layer 137 on the insulating liner 134, and a second interlayer insulating layer 140 on the first interlayer insulating layer 137. In an example, a portion of the insulating liner 134 positioned on the upper surface of the peripheral gate structure 123 may contact the second interlayer insulating layer 140.

The first interlayer insulating layer 137 may be formed of a material different from that of the insulating liner 134 and the second interlayer insulating layer 140. For example, the first interlayer insulating layer 137 may be formed of silicon oxide or a silicon oxide-based insulating material, and the insulating liner 134 and the second interlayer insulating layer 140 may be formed of silicon nitride or silicon nitride-based insulating material.

The lower structure 3 may further include second contact plugs 49p on the second source/drain regions 131, and a metal-semiconductor compound layer 146 between the second source/drain regions 131 and the second contact plugs 49p. The second contact plugs 49p may penetrate through the insulating liner 134, the first interlayer insulating layer 137, and the second interlayer insulating layer 140. The upper contact plugs 49c of the first contact plugs 42 and the second contact plugs 49p may each include a conductive plug 53 and a conductive liner 51 covering side and bottom surfaces of the conductive plug 53. For example, the conductive liner 51 may include a metal nitride, e.g., titanium nitride, and the conductive plug 53 may include a metal, e.g., tungsten.

Each of the conductive patterns 60 may include a barrier layer 55 and a conductive layer 57 on the barrier layer 55. The barrier layer 55 may include a metal nitride, e.g., titanium nitride, and the conductive layer 57 may include a metal, e.g., tungsten.

The upper surface 63s of the insulating pattern 63 may have a concave shape. The lowest portion of the upper surface 63s of the insulating pattern 63 may be located on a level lower than the upper surface of each of the conductive patterns 60. The insulating pattern 63 may include silicon nitride.

The semiconductor device 1 according to an example embodiment may further include an insulating layer, e.g., an oxide layer 65, formed on upper surfaces of the conductive patterns 60. The oxide layer 65 may be an oxide layer of the conductive layer 57. For example, when the conductive layer 57 is formed of a tungsten layer, the oxide layer 65 may be formed of a tungsten oxide layer.

An insulating etch stop layer 67 may contact the oxide layer 65 while covering the oxide layer 65. The insulating etch stop layer 67 may include at least one of, e.g., a SiBN material and a SiCN material. For example, the insulating etch stop layer 67 may be formed of a SiBN material layer. The thickness of the insulating etch stop layer 67 may be about 100 angstroms or less, e.g., about 40 angstroms to about 70 angstroms.

On the first area MA, the capacitors 70, 76, and 79 may include first capacitor electrodes 70 contacting the first conductive patterns 60c, penetrating through the insulating etch stop layer 67 and extending upwardly, a second capacitor electrode 79 on the first capacitor electrodes 70, and a capacitor dielectric 76 between the first capacitor electrodes 70 and the second capacitor electrode 79. The second capacitor electrode 79 may be referred to as a plate electrode. The capacitors 70, 76, and 79 may be DRAM cell capacitors for storing information in the DRAM device.

The semiconductor device 1 may further include, on the first area MA, a second support 73b in contact with the first capacitor electrodes 70, and a first support 73a in contact with the first capacitor electrodes 70. The second support 73b may be disposed on a higher level than the first support 73a, e.g., relative to the semiconductor substrate 5. The first and second supports 73a and 73b may serve to prevent the first capacitor electrodes 70 from collapsing or deforming. The first and second supports 73a and 73b may be formed of an insulating material.

The semiconductor device 1 may further include insulating structures 83, 86, and 89. The insulating structures 83, 86, and 89 may include a first insulating layer 83 and a second insulating layer 86 covering the insulating etch stop layer 67 and sequentially stacked, on the second area PA, and a third insulating layer 89 covering the capacitors 70, 76, and 79, on the first area MA, and covering the second insulating layer 86, on the second area PA.

The first insulating layer 83 may be formed of a first insulating oxide. The second insulating layer 86 may be formed of a second insulating oxide having a higher etching rate than the first insulating oxide. The first insulating layer 83 may be formed of silicon oxide having an etching rate lower than that of the silicon oxide of the second insulating layer 86. The etching rate of silicon oxide may be controlled by changing process conditions, e.g., changing the process temperature and/or pressure for forming silicon oxide or by changing a hydrogen content. Accordingly, the first insulating layer 83 and the second insulating layer 86 may be formed of silicon oxides having different etching rates.

A thickness of the second insulating layer 86 may be greater than a thickness of the first insulating layer 83. The thickness of the second insulating layer 86 may be about 10 to about 30 times greater than the thickness of the first insulating layer 83. A thickness of the second insulating layer 86 may be greater than a thickness of the third insulating layer 89.

A thickness of the third insulating layer 89 may be greater than a thickness of the first insulating layer 83. The thickness of the third insulating layer 89 may be about 2 to about 10 times greater than the thickness of the first insulating layer 83. The thickness of the first insulating layer 83 may range from about 600 angstroms to about 1200 angstroms.

The capacitor contact plug 96c may pass through the third insulating layer 89 and may contact the second capacitor electrode 79. The capacitor contact plug 96c may include a lower portion extending into the second capacitor electrode 79 while being in contact with the second capacitor electrode 79, and an upper portion penetrating through the third insulating layer 89. In the capacitor contact plug 96c, the upper portion may have a greater width than the lower portion. The capacitor contact plug 96c may include a portion in which a lateral inclination is changed due to a difference in widths between the upper portion and the lower portion.

The capacitor contact plug 96c and the peripheral contact plug 96p may be formed of the same material. For example, each of the capacitor contact plug 96c and the peripheral contact plug 96p may include a conductive plug 95 and a conductive liner 94 covering side and bottom surfaces of the conductive plug 95. The conductive plug 95 may include a conductive material, e.g., tungsten, and the conductive liner 94 may include a conductive material, e.g., TiN.

On the second area PA, the peripheral contact plug 96p may penetrate through the insulating structures 83, 86 and 89 and the insulating etch stop layer 67 and may be in contact with the second conductive pattern 60p. The second conductive pattern 60p may include a wiring portion 60p1 (e.g., a linear portion extending in the X-direction in FIG. 1) and a pad portion 60p2 (e.g., a portion integral with the wiring portion 60p1, having a larger width in the Y-direction than the wiring portion 60p, and overlapping the peripheral contact plug 96p). The peripheral contact plug 96p may contact the pad portion 60p2 of the second conductive pattern 60p.

For example, the second conductive pattern 60p may be formed of only the pad portion 60p2 in contact with the peripheral contact plug 96p. For example, the second conductive pattern 60p may be provided as a plurality of conductive patterns.

Referring to FIG. 3, the peripheral contact plug 96p may include a first plug region P1 in contact with the second conductive pattern 60p (e.g., with the pad portion 60p2), a second plug region P2 passing through the insulating etch stop layer 67, on the first plug region P1, a third plug region P3 including a first side surface S1, on the second plug region P2, a fourth plug region P4 including lower and upper second side surfaces S2 and S3, on the third plug region P3, and a fifth plug region P5 including a third side surface S4, on the fourth plug region P4.

The fourth plug region P4 may include a lower region P4a and an upper region P4b on the lower region P4a. The lower region P4a has a lower second side surface S2 that is inclined to increase in width in the upper direction, and the upper region P4b has an upper side surface S3 that is inclined to decrease in width in the upper direction. The upper direction may be a direction from the lower region P4a toward the upper region P4b.

In the fourth plug region P4, a vertical thickness of the lower region P4a may be substantially the same as a vertical thickness of the upper region P4b (e.g., along the Z-direction of FIG. 2B). A total vertical thickness of the fourth plug region P4 (i.e., a combined thickness of the lower region P4a and the upper region P4b) may be greater than a vertical thickness of the third plug region P3. Each of the vertical thickness of the lower region P4a and the vertical thickness of the upper region P4b may be smaller than the vertical thickness of the third plug region P3.

The third plug region P3 and the lower region P4a may pass through the first insulating layer 83. The upper region P4b and the fifth plug region P5 may pass through the second insulating layer 86 and the third insulating layer 89.

The first side surface S1 adjacent to the fourth plug region P4 may have a first inclination, and the third side surface S4 adjacent to the fourth plug region P4 may have a second inclination. At least a portion of the lower and upper second side surfaces S2 and S3 may have an inclination different from the first and second inclinations of the first and third side surfaces S1 and S4.

The third plug region P3 may have a first vertical thickness. The fourth plug region P4 may have a second vertical thickness. The fifth plug region P5 may have a thickness greater than a half of a sum of the second vertical thickness and the first vertical thickness. A vertical thickness of the fifth plug region P5 may be about twice or more greater than a sum of the vertical thicknesses of the first to fourth plug regions P1, P2, P3, and P4. The vertical thickness of the fifth plug region P5 may be about five times greater than a sum of the vertical thicknesses of the first to fourth plug regions P1, P2, P3, and P4. The vertical thickness of the fifth plug region P5 may be about ten to about thirty times greater than a sum of the vertical thicknesses of the first to fourth plug regions P1, P2, P3, and P4.

The first side surface S1 may have a first inclination $\theta 1$, the lower second side surface S2 may have a second inclination angle $\theta 2$, the upper second side surface S3 may have a third inclination angle $\theta 3$, and the third side surface S4 may have a fourth inclination angle $\theta 4$. The first inclination angle $\theta 1$ may be about 89 degrees to about 90 degrees, the second inclination angle $\theta 2$ may be about 80 degrees to about 82 degrees, the third inclination angle $\theta 3$ may be about 83 degrees to about 85 degrees, and the fourth inclination angle $\theta 4$ may be about 86 degrees to about 88 degrees. Each of the first, second, and fourth inclination angles $\theta 1$, $\theta 2$, and $\theta 4$ refers to an angle between a bottom of the semiconductor substrate 5 and an outer surface of the conductive liner 94 facing away from the peripheral contact plug 96p. The third inclination angle $\theta 3$ refers to an angle between a bottom of the semiconductor substrate 5 and an inner surface of the conductive liner 94 facing an interior of the peripheral contact plug 96p.

The first inclination of the first side surface S1 may be steeper than the inclination of each of the lower second side surface S2, the upper second side surface S3, and the third side surface S4. The second inclination of the third side surface S4 may be steeper than the respective inclinations of the lower second side surface S2 and the upper second side surface S3. The inclination of the upper second side surface S3 may be steeper than the inclination of the lower second side surface S2. A sharp cusp may be formed at the boundary between the lower second side surface S2 and the upper second side surface S3.

The width of the lower portion of the second plug region P2 may be smaller, e.g., narrower, than the width of the upper portion of the second plug region P2. A maximum width of the first plug region P1 may be smaller, e.g., narrower, than a minimum width of the third plug region P3. A maximum width of the fourth plug region P4 may be greater than a width of the third plug region P3 adjacent to the fourth plug region P4. A maximum width of the fourth plug region P4 may be greater than a width of the fifth plug region P5 adjacent to the fourth plug region P4. All widths refer to distances along the Y-direction in FIG. 3.

The fourth plug region P4 may be disposed at a level lower than that of the first support 73a, e.g., a top of the upper portion P4b of the fourth plug region P4 may be disposed at a level lower than a bottom of the first support 73a relative to the semiconductor substrate 5. The fourth plug region P4 may be disposed at a level lower than the middle between the upper and lower portions of the peripheral contact plug 96p.

Next, various modifications of the peripheral contact plug 96p will be described with reference to FIGS. 4 to 7, respectively. FIGS. 4 to 7 are partially enlarged views illustrating a region corresponding to the partially enlarged view of FIG. 3, and may represent a deformed portion of the peripheral contact plug 96p in the partially enlarged view of FIG. 3. Hereinafter, the portion in which the peripheral contact plug 96p is deformed will be mainly described.

Figure 4:
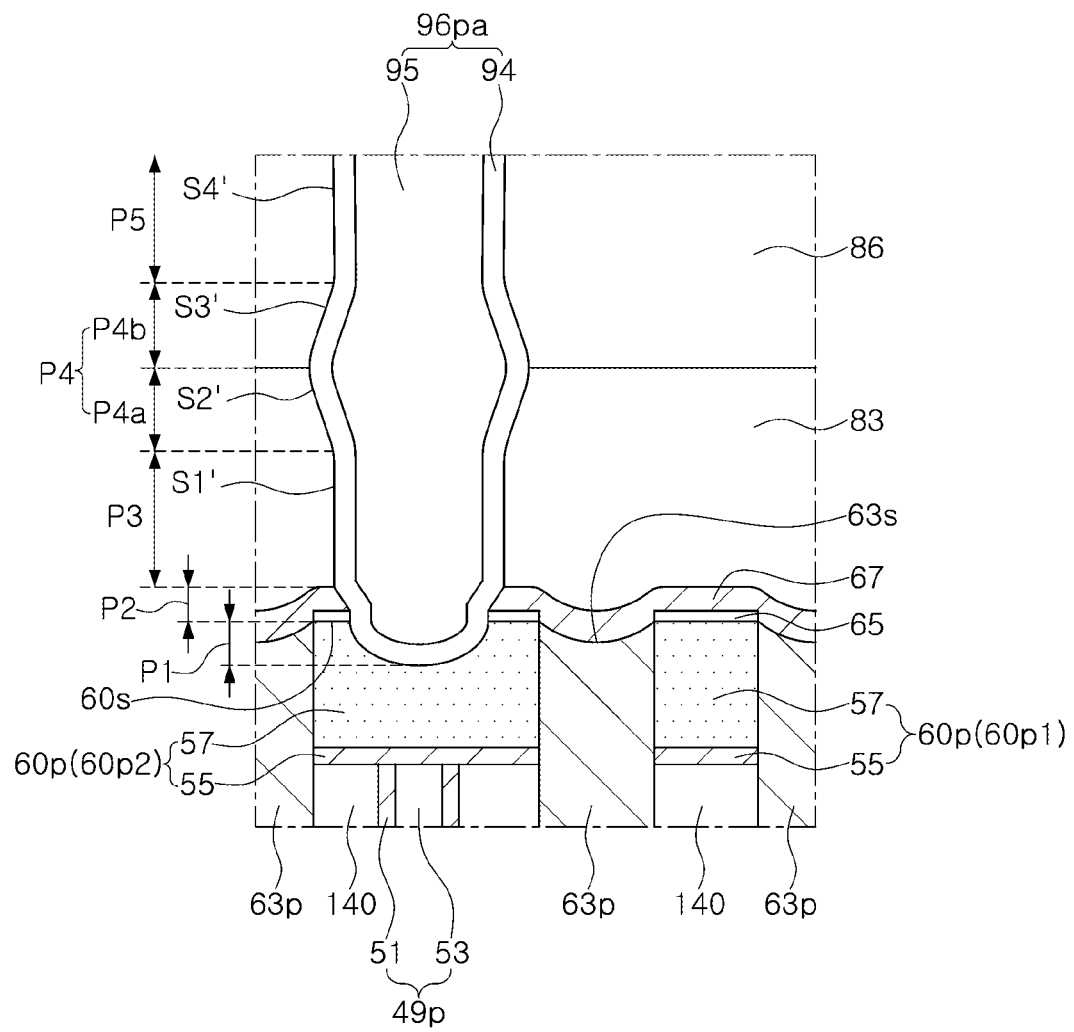
FIG. 4 is a partially enlarged view illustrating a modified example of a semiconductor device according to an example embodiment.

In a modified example, referring to FIG. 4, a peripheral contact plug 96pa may include a first side surface S1', a lower second side surface S2', an upper second side surface S3', and a third side surface S4' in positions corresponding to the first side surface S1, the lower second side surface S2, the upper second side surface S3 and the third side surface S4 described with reference to FIG. 3, respectively. A boundary area between the first side surface S1' and the lower second side surface S2' may be a curved surface, and a boundary area between the lower second side surface S2' and the upper second side surface S3' may be a curved surface. A boundary area between the upper second side surface S3' and the third side surface S4' may be a curved surface.

Figure 5:
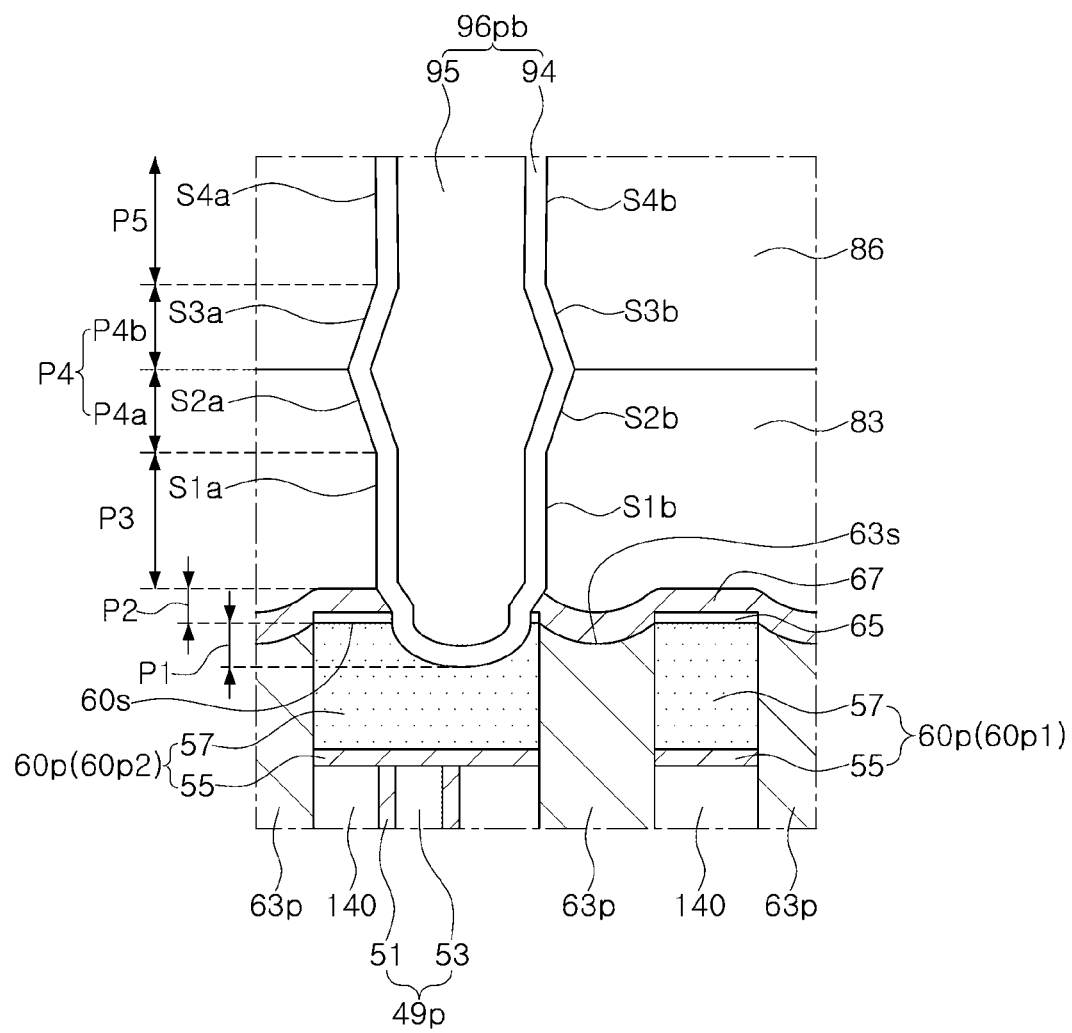
FIG. 5 is a partially enlarged view illustrating a modified example of a semiconductor device according to an example embodiment.

In a modified example, referring to FIG. 5, a peripheral contact plug 96pb may have a center shifted from the center of the second conductive pattern 60p to any one side, e.g., central vertical axes of the peripheral contact plug 96pb and the second conductive pattern 60p may be misaligned. The peripheral contact plug 96pb may include first side surfaces S1a and S1b, lower side surfaces S2a and S2b, upper side surfaces S3a and S3b, and third side surfaces S4a and S4b in positions corresponding to the first side surface S1, the lower second side surface S2, the upper second side surface S3, and the third side surface S4 described in FIG. 3, respectively. In the cross-sectional structure, as illustrated in FIG. 5, any one (S1b, S2b, S3b, S4b) of the opposite side surfaces of the peripheral contact plug 96pb may not overlap the second conductive pattern 60p, but may overlap the insulating pattern 63p.

Figure 6:
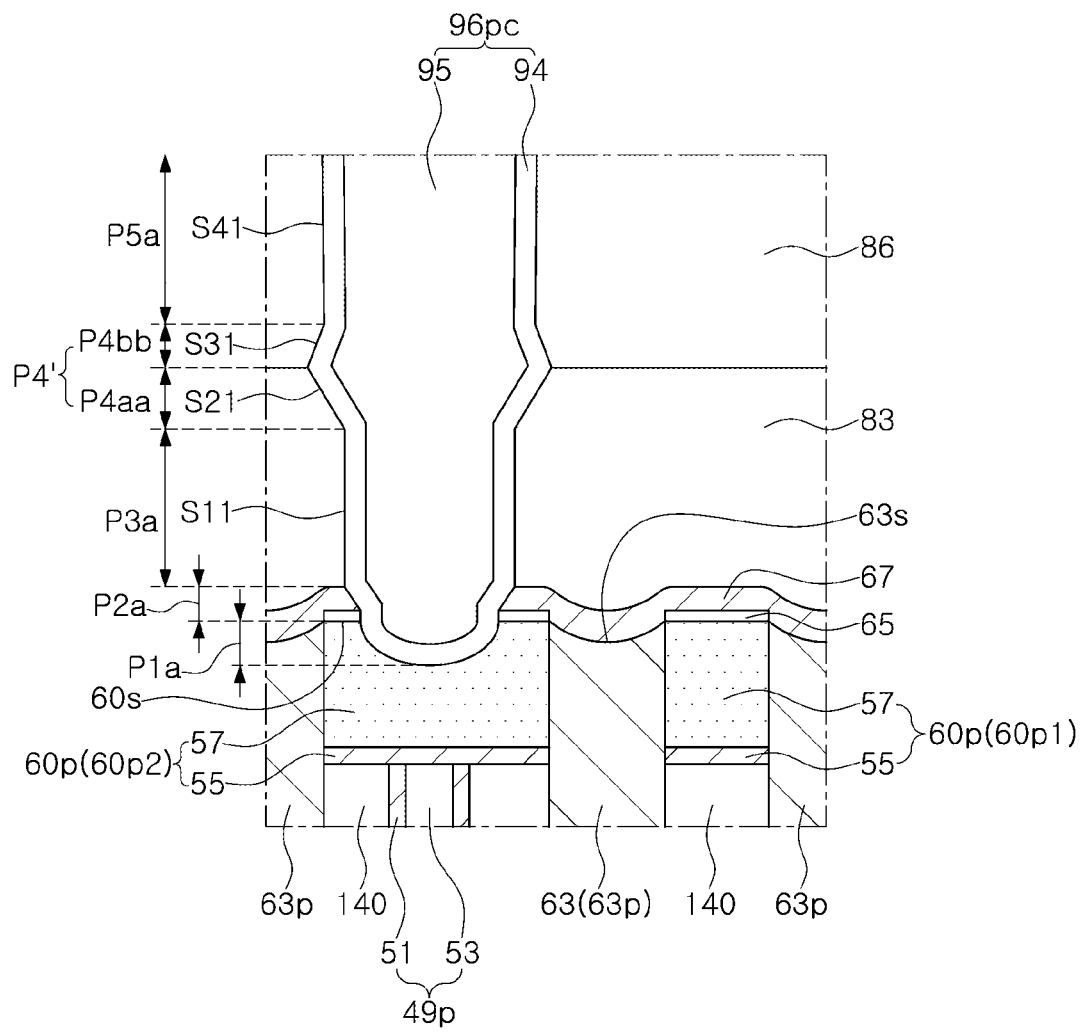
FIG. 6 is a partially enlarged view illustrating a modified example of a semiconductor device according to an example embodiment.

In a modified example, referring to FIG. 6, a peripheral contact plug 96pc may include a first plug region P1a in contact with the second conductive pattern 60p, a second plug region P2a passing through the insulating etch stop layer 67, on the first plug region P1a, a third plug region P3a including a first side surface S11, on the second plug region P2a, a fourth plug region P4' including second side surfaces S21 and S31, on the third plug region P3a, and a fifth plug region P5a including a third side surface S41 on the fourth plug region P4'.

The fourth plug region P4' may include a lower region P4aa and an upper region P4bb on the lower region P4aa. The lower region P4aa has a lower second side surface S21 inclined to increase in width in the upper direction, and the upper region P4bb has an upper second side surface S31 inclined to decrease in width in the upper direction. The upper direction may be a direction from the lower region P4aa toward the upper region P4bb.

A vertical thickness of the lower region P4aa may be greater than a vertical thickness of the upper region P4bb. A minimum width of the upper region P4bb may be greater than a minimum width of the lower region P4aa. A minimum width of the fifth plug region P5a may be greater than a maximum width of the third plug region P3a. A maximum width of the fourth plug region P4' may be greater than a minimum width of the fifth plug regions P5a and a maximum width of the third plug region P3a, respectively. A sharp cusp may be formed at the boundary between the lower second side surface S21 and the upper second side surface S31.

Figure 7:
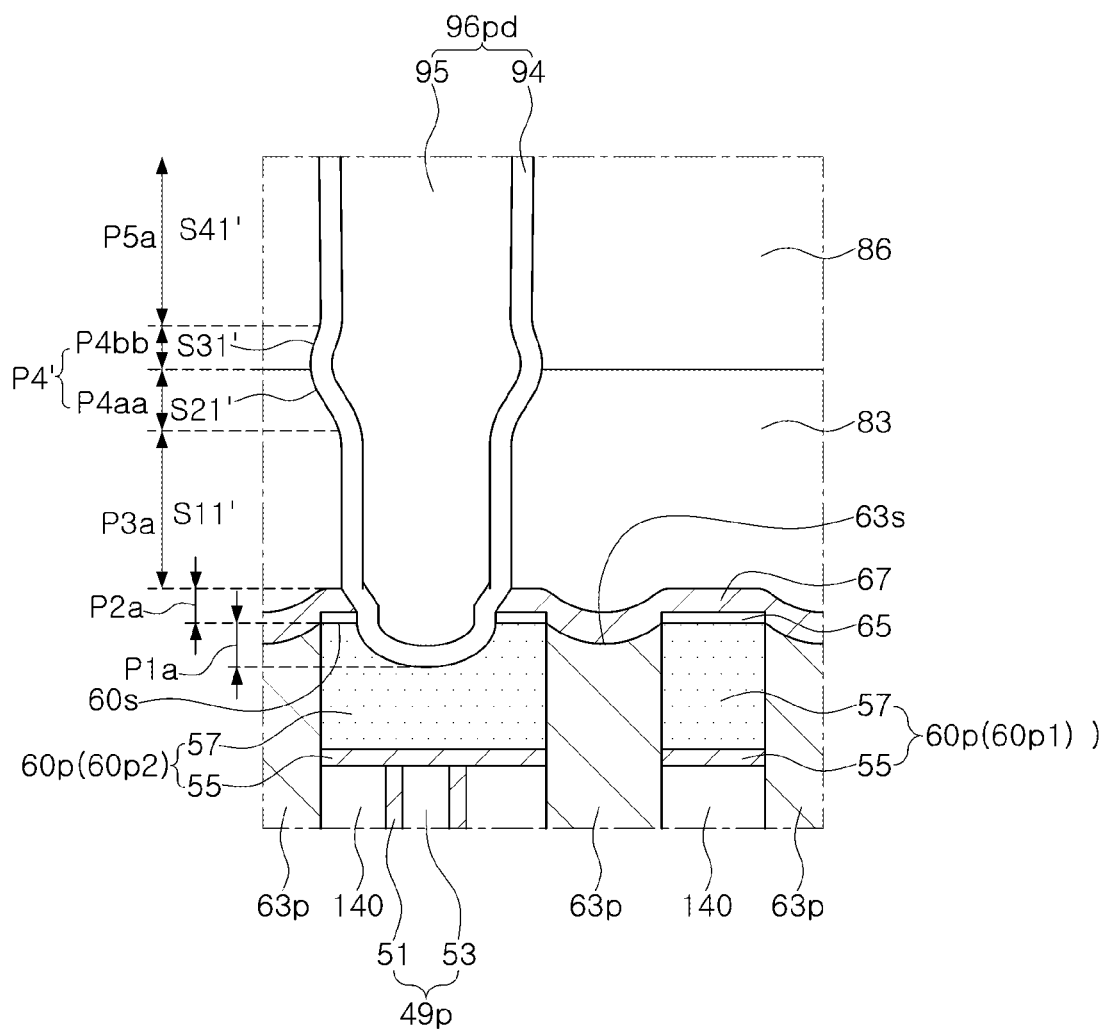
FIG. 7 is a partially enlarged view illustrating a modified example of a semiconductor device according to an example embodiment.

In a modified example, referring to FIG. 7, a peripheral contact plug 96pd may include a first side surface S11', second side surfaces S21' and S31', and a third side surface S41' in positions corresponding to the first side surface S11, the second side surfaces S21 and S31, and the third side surface S41 described with reference to FIG. 6, respectively.

A boundary area between the first side surface S11' and the lower second side surface S21' may be a curved surface, and a boundary area between the lower second side surface S21' and the upper second side surface S31' may be a curved surface. A boundary region between the upper second side surface S31' and the third side surface S41' may be a curved surface.

Figure 8:
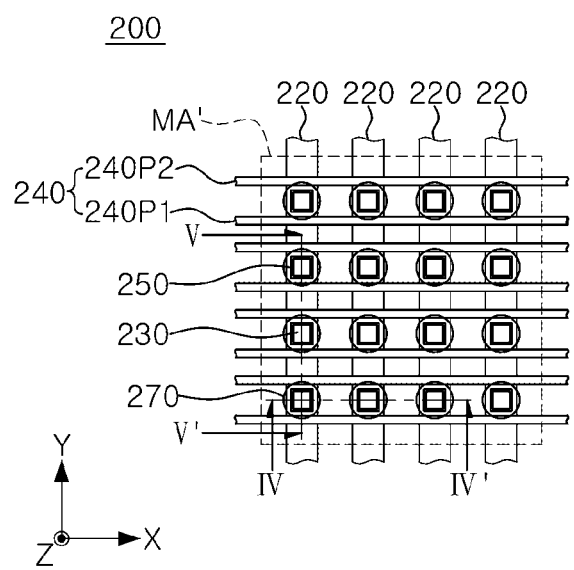
FIGS. 8 and 9 are views illustrating a modified example of a semiconductor device according to an example embodiment.
Figure 9:
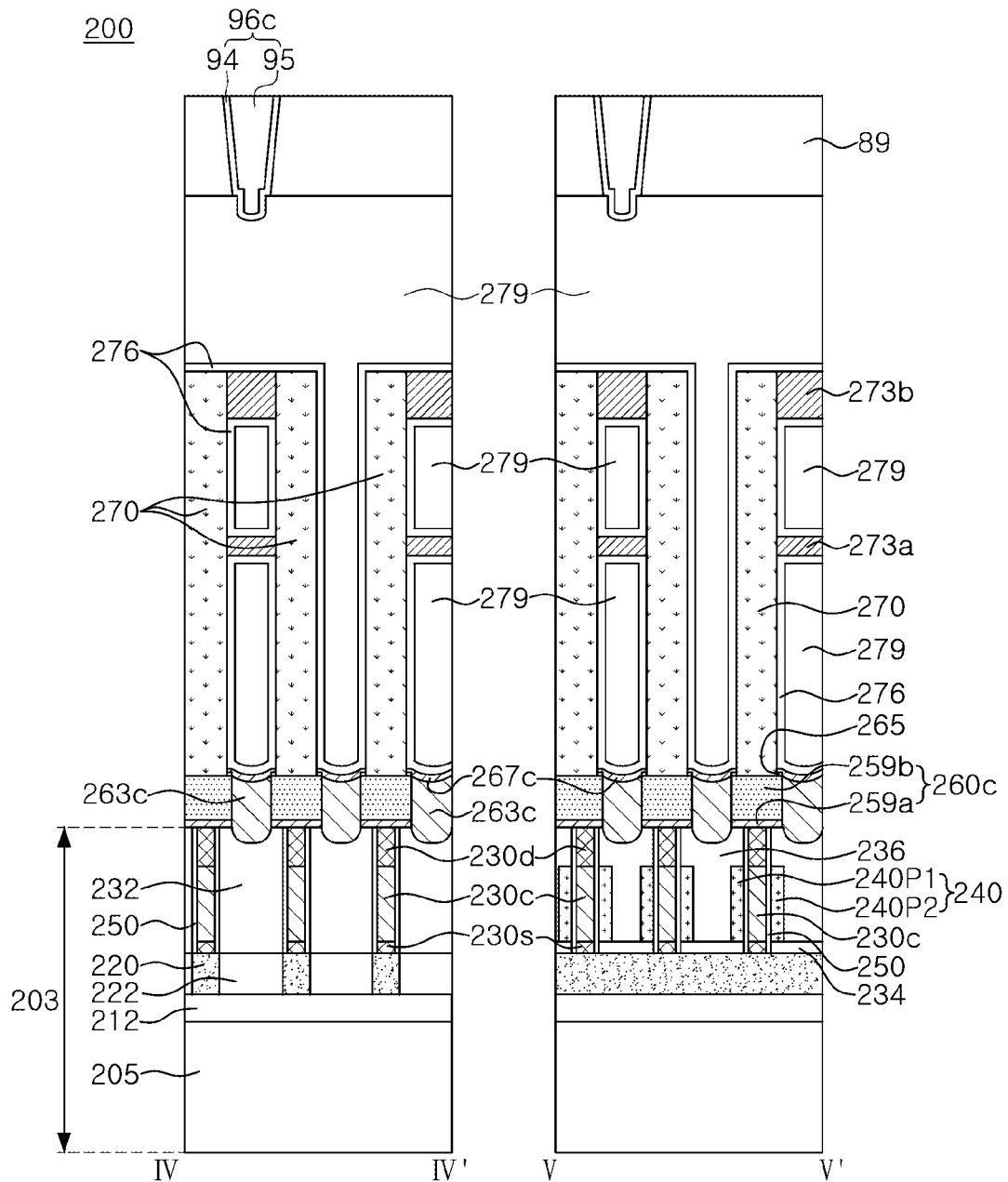

Next, a modified example of the lower structure 3 in the first area MA described with reference to FIGS. 1 and 2A will be described with reference to FIGS. 8 and 9. In FIGS. 8 and 9, FIG. 8 is a plan view schematically illustrating a first area MA' of a semiconductor device 200 in a modified example, and FIG. 9 is a cross-sectional view along line IV-IV' and line V-V' of FIG. 8.

Referring to FIGS. 8 and 9, the semiconductor device 200 according to an example embodiment may include a lower structure 203 modified from the lower structure 3 in the first area MA described with reference to FIGS. 1 and 2A. The semiconductor device 200 may include any one of the peripheral contact plug 96p as illustrated in FIGS. 2B and 3 or the peripheral contact plug 96pa, 96pb, 96pc, and 96pd as described in FIGS. 4 to 7.

The semiconductor device 200 may include first conductive patterns 260c, an insulating pattern 263c, an insulating etch stop layer 267c, capacitors 270, 276 and 279, and first and second supports 273a and 273b, corresponding to the first conductive patterns 60c, the insulating pattern 63, the insulating etch stop layer 67, the capacitors 70, 76 and 79, and the first and second supports 73a and 73b, described with reference to FIG. 2A, respectively. The lower structure 203 may further include the capacitor contact plug 96c, and the first conductive patterns 260c may include a barrier layer 259a and a conductive layer 259b sequentially stacked.

The lower structure 203 may include a semiconductor substrate 205, a plurality of first conductive lines 220 disposed on the semiconductor substrate 205, channel layers 230c, lower source/drain regions 230s, upper source/drain regions 230d, cell gate electrodes 240, and cell gate dielectrics 250. The channel layers 230c, the lower source/drain regions 230s, the upper source/drain regions 230d, and the cell gate electrodes 240 may constitute vertical channel transistors. In this case, the vertical channel transistors may be referred to as cell transistors. The vertical channel transistor may refer to a structure in which a channel length of each of the channel layers 230c extends from the semiconductor substrate 205 in the vertical direction (the Z-direction).

The lower structure 203 may further include a lower insulating layer 212 disposed on the semiconductor substrate 205. On the lower insulating layer 212, the plurality of first conductive lines 220 may be spaced apart from each other in the second horizontal direction (e.g., the X-direction) and extend in the first horizontal direction (e.g., the Y-direction).

The lower structure 203 may further include a plurality of first lower insulating patterns 222 filling a space between the plurality of first conductive lines 220, on the lower insulating layer 212. The plurality of first lower insulating patterns 222 may extend in the first horizontal direction (e.g., the Y-direction), and upper surfaces of the plurality of first lower insulating patterns 222 may be disposed on the same level as the upper surfaces of the plurality of first conductive lines 220. The plurality of first conductive lines 220 may function as bit lines of the semiconductor device 200 according to an example embodiment.

In an illustrative example, the plurality of first conductive lines 220 may include, e.g., doped polysilicon, metal, conductive metal nitride, conductive metal silicide, conductive metal oxide, or combinations thereof. For example, the plurality of first conductive lines 220 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof. The plurality of first conductive lines 220 may include a single layer or multiple layers of the aforementioned materials. In an illustrative example, the plurality of first conductive lines 220 may include a 2D semiconductor material, e.g., the 2D semiconductor material may include graphene, carbon nanotube, or combinations thereof.

The channel layers 230c may be arranged to be spaced apart from each other in the second horizontal direction (e.g., the X-direction) and the first horizontal direction (e.g., the Y-direction) in a matrix form, on the plurality of first conductive lines 220. The lower source/drain regions 230s, the channel layers 230c, and the upper source/drain regions 230d may be sequentially stacked. In an illustrative example, any one channel layer 230c and lower and upper source/drain regions 230s and 230d disposed below/on the any one channel layer 230c may have a first width in the second horizontal direction (e.g., the X-direction) and a first height in the vertical direction (e.g., the Z-direction), and the first height may be greater than the first width, e.g., the first height may be about 2 to 10 times the first width.

For example, the channel layers 230c may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_x$-$In_yZn_zO$, $Ga_xZn_ySn_zO$, $Al_xZn_ySn_zO$, $Yb_xGa_yZn_zO$, $In_xGa_yO$, or combinations thereof. The channel layers 230c may include a single layer or multiple layers of the oxide semiconductor. In some examples, the channel layers 230c may have a bandgap energy greater than a bandgap energy of silicon. For example, the channel layers 230c may have a bandgap energy of about 1.5 eV to about 5.6 eV. For example, the channel layer 230c may have optimal channel performance when it has a bandgap energy of about 2.0 eV to 4.0 eV. For example, the channel layers 230c may be polycrystalline or amorphous.

For example, the channel layers 230c may include a 2D semiconductor material, e.g., the 2D semiconductor material may include graphene, carbon nanotube, or a combination thereof. For example, the channel layers 230c may include a semiconductor material, e.g., silicon. Hereinafter, one channel layer 230c and one cell gate electrode 240 will be mainly described.

The cell gate electrode 240 may extend in the second horizontal direction (e.g., the X-direction) on both sidewalls of the channel layer 230c. The cell gate electrode 240 may include a first sub-gate electrode 240P1 facing the first sidewall of the channel layer 230c, and a second sub-gate electrode 240P2 facing a second sidewall opposite to the first sidewall of the channel layer 230c. As one channel layer 230c is disposed between the first sub-gate electrode 240P1 and the second sub-gate electrode 240P2, the semiconductor device 200 according to an example embodiment may have a dual gate transistor structure. However, embodiments are not limited thereto, e.g., a single gate transistor structure may also be implemented by omitting the second sub-gate electrode 240P2 and forming only the first sub-gate electrode 240P1 facing the first sidewall of the channel layer 230c.

The cell gate electrode 240 may include doped polysilicon, metal, conductive metal nitride, conductive metal silicide, conductive metal oxide, or combinations thereof. For example, the cell gate electrode 240 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof.

The cell gate dielectric 250 may surround a sidewall of the channel layer 230c and may be interposed between the channel layer 230c and the cell gate electrode 240. For example, as illustrated in FIG. 9, the entire sidewall of the channel layer 230c may be surrounded by the cell gate dielectric 250, and a portion of the sidewall of the cell gate electrode 240 may contact the cell gate dielectric 250. In other embodiments, the cell gate dielectric 250 may extend in the extension direction of the cell gate electrode 240, e.g., in the second horizontal direction (X-direction), and among sidewalls of the channel layer 230c, only two sidewalls facing the cell gate electrode 240 may contact the cell gate dielectric 250.

In an illustrative example, the cell gate dielectric 250 may be formed of a silicon oxide film, a silicon oxynitride film, a high-k film having a higher dielectric constant than that of a silicon oxide film, or combinations thereof. The high-k film may be formed of, e.g., a metal oxide or a metal oxynitride. For example, the high-k film usable as the cell gate dielectric 250 may be formed of $HfO_2$, HfSiO, HfSiON, HfTaO, HfTiO, HfZrO, $ZrO_2$, $Al_2O_3$, or combinations thereof.

The lower structure 203 may further include a plurality of second lower insulating patterns 232 disposed on the plurality of first lower insulating patterns 222. The second lower insulating patterns 232 may extend in the first horizontal direction (e.g., in the Y-direction), and a channel layer 230c may be disposed between adjacent two second lower insulating patterns 232 among the plurality of second lower insulating patterns 232.

The lower structure 203 may further include a first buried layer 234 and a second buried layer 236 disposed between two adjacent second lower insulating patterns 232 to be located in a space between two adjacent channel layers 230c. The first buried layer 234 may be disposed on the bottom of the space between two adjacent channel layers 230c, and the second buried layer 236 may be formed to fill the remainder of the space between the two adjacent channel layers 230c, on the first buried layer 234. The upper surface of the second buried layer 236 may be disposed on the same level as an upper surface of the channel layer 230c, and the second buried layer 236 may cover an upper surface of the cell gate electrode 240. Alternatively, the plurality of second lower insulating patterns 232 may be formed of a continuous material layer with the plurality of first lower insulating patterns 222, or the second buried layer 236 may be formed of a continuous material layer with the first buried layer 234.

Figure 10:
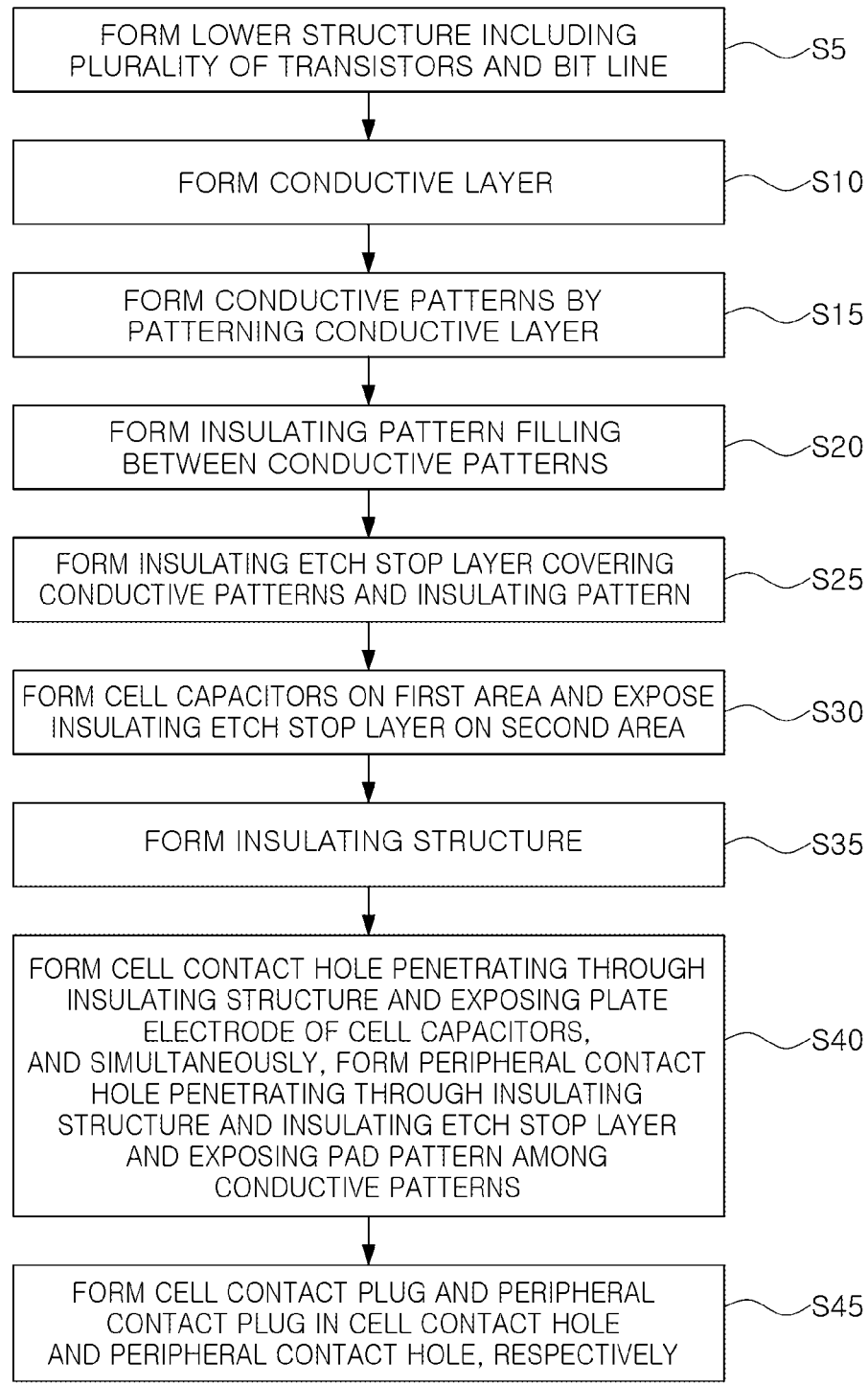
FIG. 10 is a flow diagram illustrating a method of forming a semiconductor device according to an example embodiment.
Figure 11A:
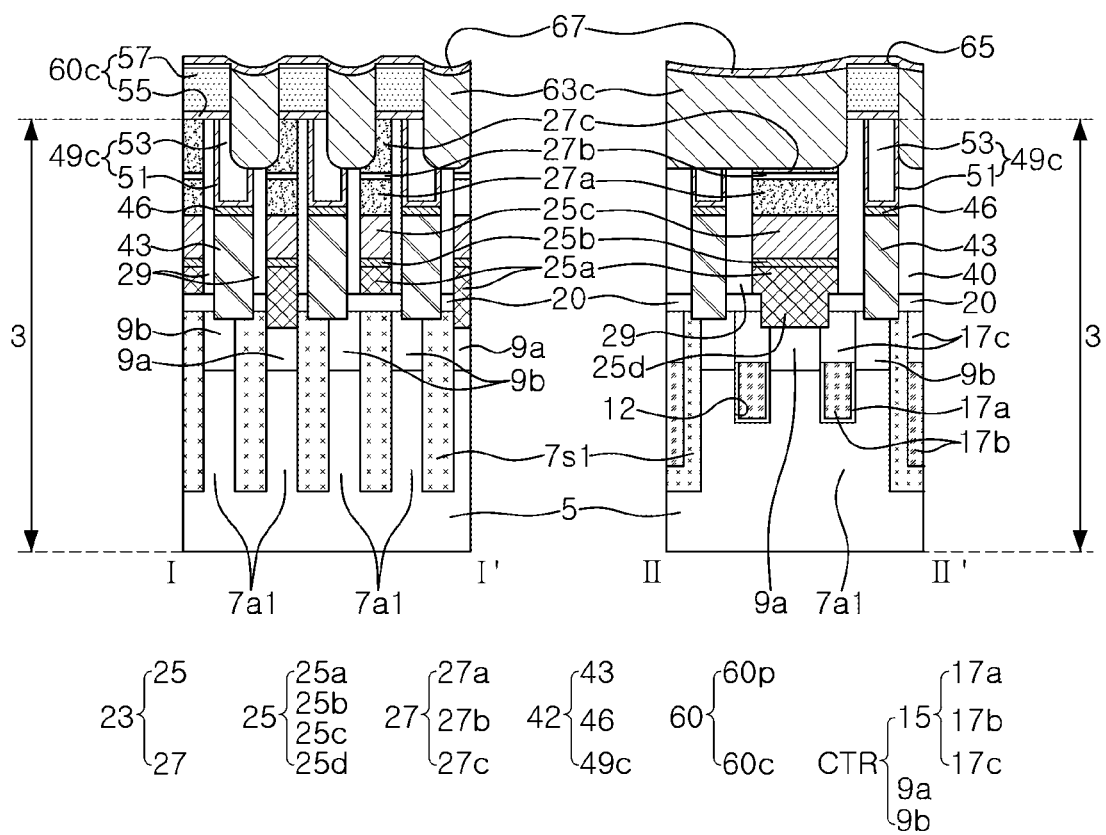
FIGS. 11A to 14B are cross-sectional views illustrating stages in a method of forming a semiconductor device according to an example embodiment.

Next, an illustrative example of a method of forming a semiconductor device according to an example embodiment will be described with reference to FIGS. 10 to 14B. FIG. 10 is a process flow chart of a method of forming a semiconductor device according to an example embodiment, and FIGS. 11A to 14B are cross-sectional views of stages in the method of forming a semiconductor device according to an example embodiment. In detail, FIGS. 11A, 12 and 14A are cross-sectional views along lines I-I' and II-II' of FIG. 1, and FIGS. 11B, 13 and 14B are cross-sectional views along line III-III' of FIG. 1.

Figure 11B:
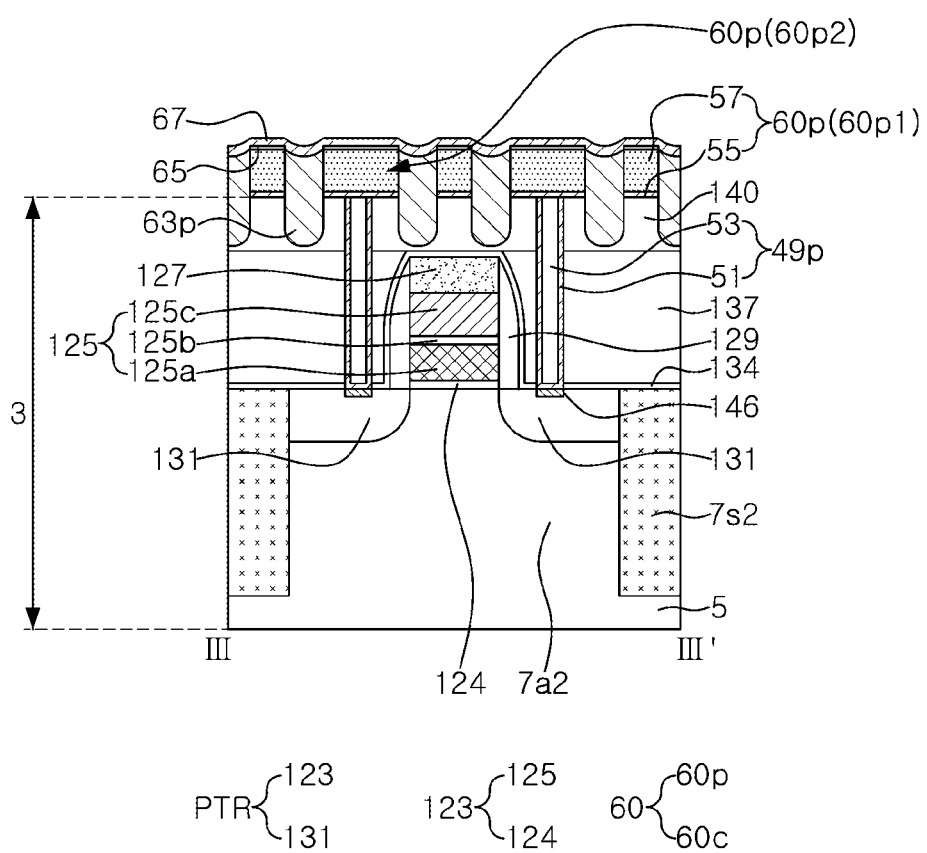
Figure 12:
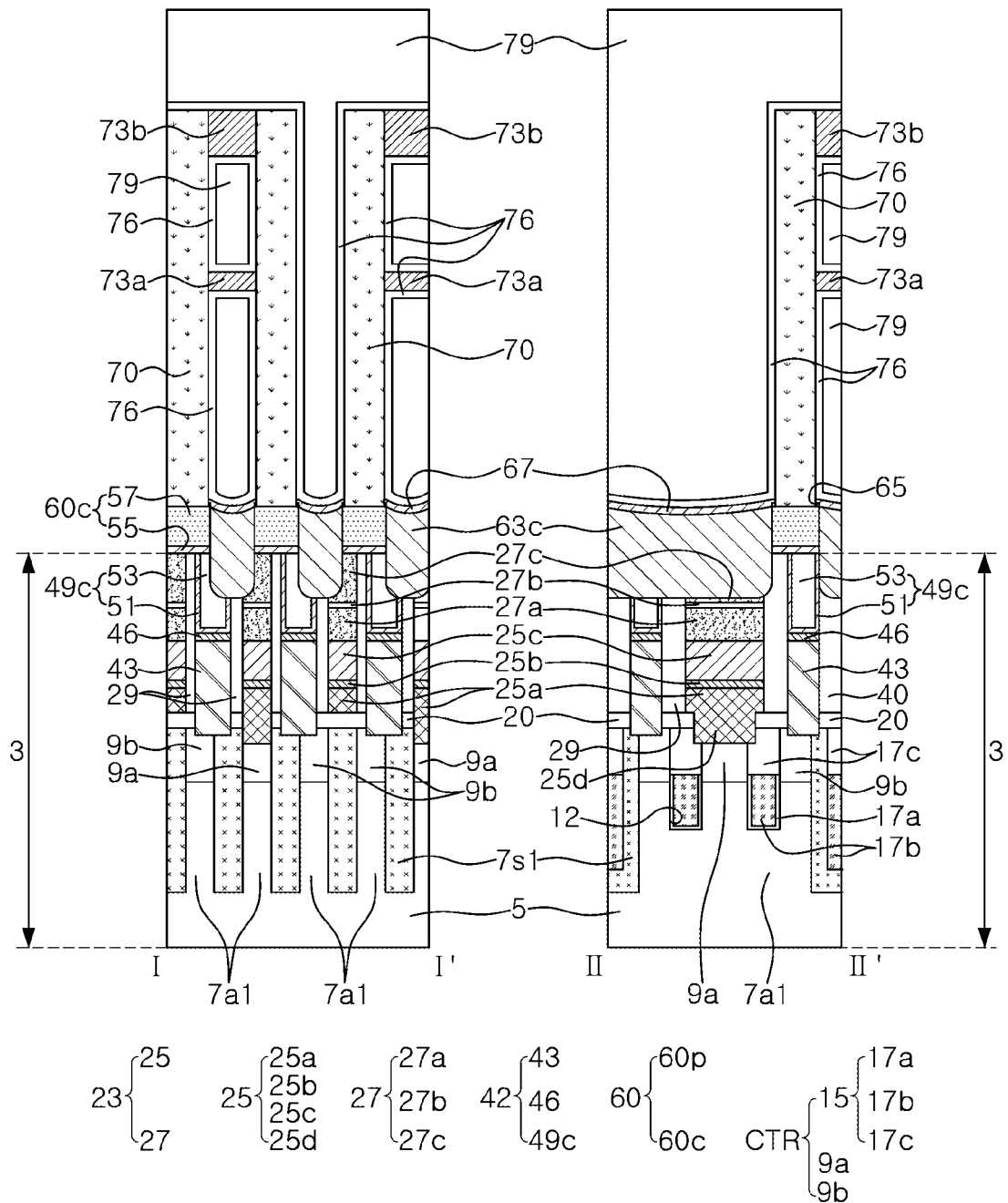

Referring to FIGS. 10, 11A, and 11B, the lower structure 3 including the plurality of transistors CTR and PTR and the bit lines 25 may be formed (S5). The lower structure 3 may have the first area MA and the second area PA, as described with reference to FIGS. 1 to 3.

The plurality of transistors CTR and PTR may include the cell transistors CTR in the first area MA, and the peripheral transistor PTR in the second area PA. The bit lines 25 may be formed in the first area MA. The lower structure 3 may further include the first contact plugs 42 formed in the first area MA, and the second contact plugs 49p formed in the second area PA, as described with reference to FIGS. 1 to 3.

A conductive layer may be formed (S10). The conductive layer may be formed on the lower structure 3.

By patterning the conductive layer, the conductive patterns 60 may be formed (S15). The conductive patterns 60 may include the first conductive patterns 60c formed on the first area MA, and the second conductive patterns 60p formed on the second area PA. Each of the conductive patterns 60 may include the barrier layer 55 and the conductive layer 57 on the barrier layer 55.

Insulating patterns 63c and 63p filling between the conductive patterns 60 may be formed (S20). The insulating patterns 63c and 63p may include first insulating patterns 63c filling between the first conductive patterns 60c, and second insulating patterns 63p filling between the second conductive patterns 60p. Forming the insulating patterns 63c and 63p filling the spaces between the conductive patterns 60 may include forming an insulating layer covering the conductive patterns 60p and planarizing the insulating layer until the conductive patterns 60p are exposed.

To prevent an electrical short between adjacent conductive patterns among the conductive patterns 60, the insulating layer may be planarized until the upper surfaces of the insulating patterns 63c and 63p are formed to have a concave shape. Surfaces of the conductive patterns 60 may be oxidized to form oxide layers 65 on the upper surfaces of the conductive patterns 60.

An insulating etch stop layer 67 covering the conductive patterns 60 and the insulating patterns 63c and 63p may be formed (S25). The insulating etch stop layer 67 may include at least one of, e.g., a SiBN material and a SiCN material.

Referring to FIGS. 10, 11B and 12, the cell capacitors 70, 76, and 79 may be formed on the first area MA, and the insulating etch stop layer 67 on the second area PA may be exposed (S30).

Forming the cell capacitors 70, 76 and 79 may include forming a mold structure including a lower mold layer, a first support layer, an upper mold layer and a second support layer sequentially stacked on the insulating etch stop layer 67, forming storage node contact holes penetrating through the mold structure and the insulating etch stop layer 67 and exposing the first conductive patterns 60c, forming the first capacitor electrodes 70 filling the storage node contact holes, etching a portion of the mold structure to form the first support 73a and the second support 73b remaining on the first area MA, removing all of the lower and upper mold layers of the mold structure, and forming the capacitor dielectric 76 and the second capacitor electrode 79 on the first area MA. The second capacitor electrode 79 may be referred to as a plate electrode.

Figure 13:
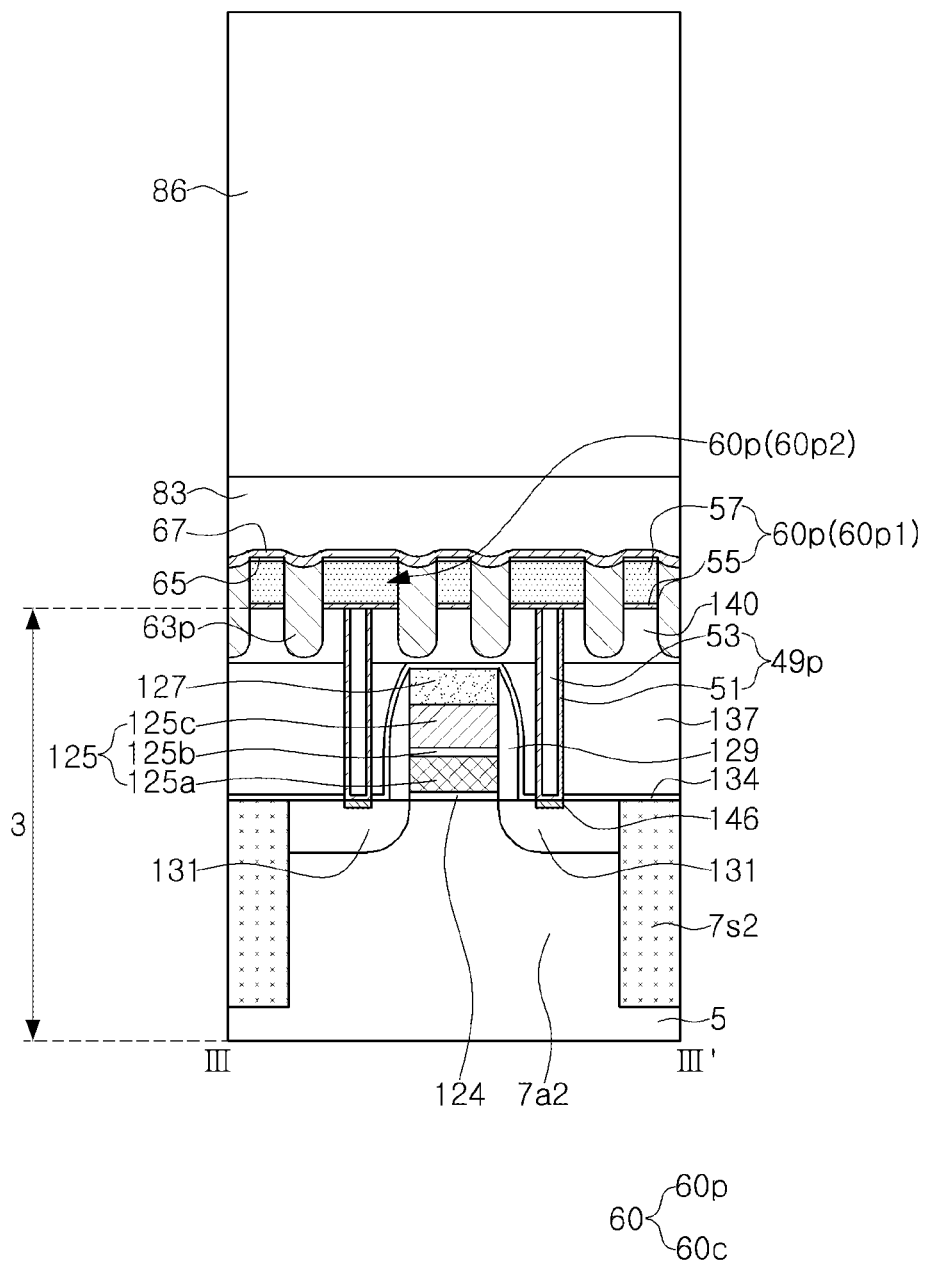
Figure 14A:
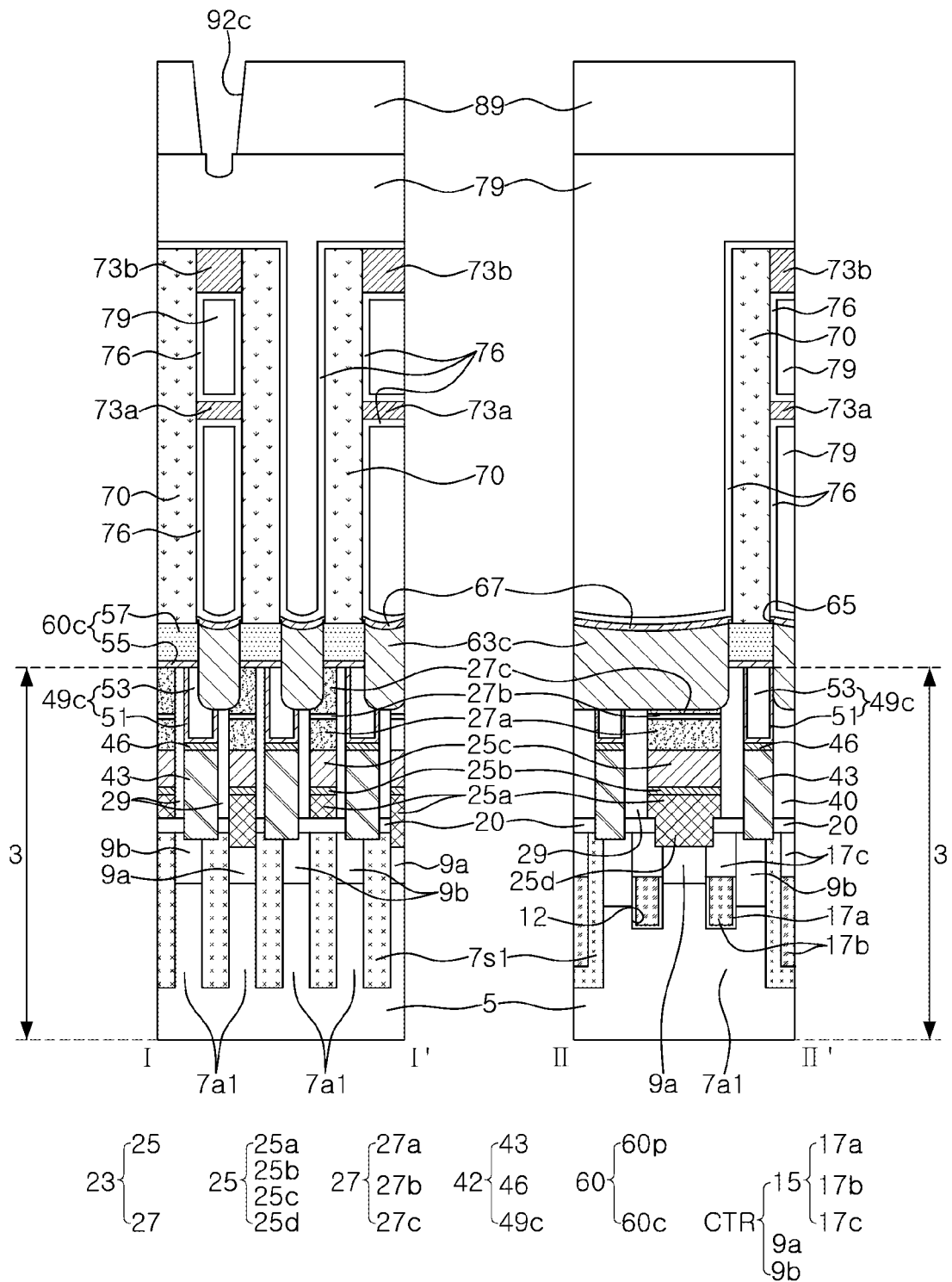

Referring to FIG. 13, the first insulating layer 83 and the second insulating layer 86 may be sequentially deposited on the substrate on which the cell capacitors 70, 76, and 79 are formed, and the first insulating layer 83 and the second insulating layer 86 may be planarized until the second capacitor electrode, e.g., the plate electrode 79, is exposed. Accordingly, the first insulating layer 83 and the second insulating layer 86 sequentially stacked on the insulating etch stop layer 67 may be formed on the second area PA.

In another example, after forming the first insulating layer 83, oxygen plasma treatment may be performed on the first insulating layer 83, and then, the second insulating layer 86 may be formed. This oxygen plasma treatment may be performed to form the contact plugs (96pa of FIG. 4, 96pd of FIG. 7) including side surfaces having a curved shape as described with reference to FIGS. 4 and 7.

Figure 14B:
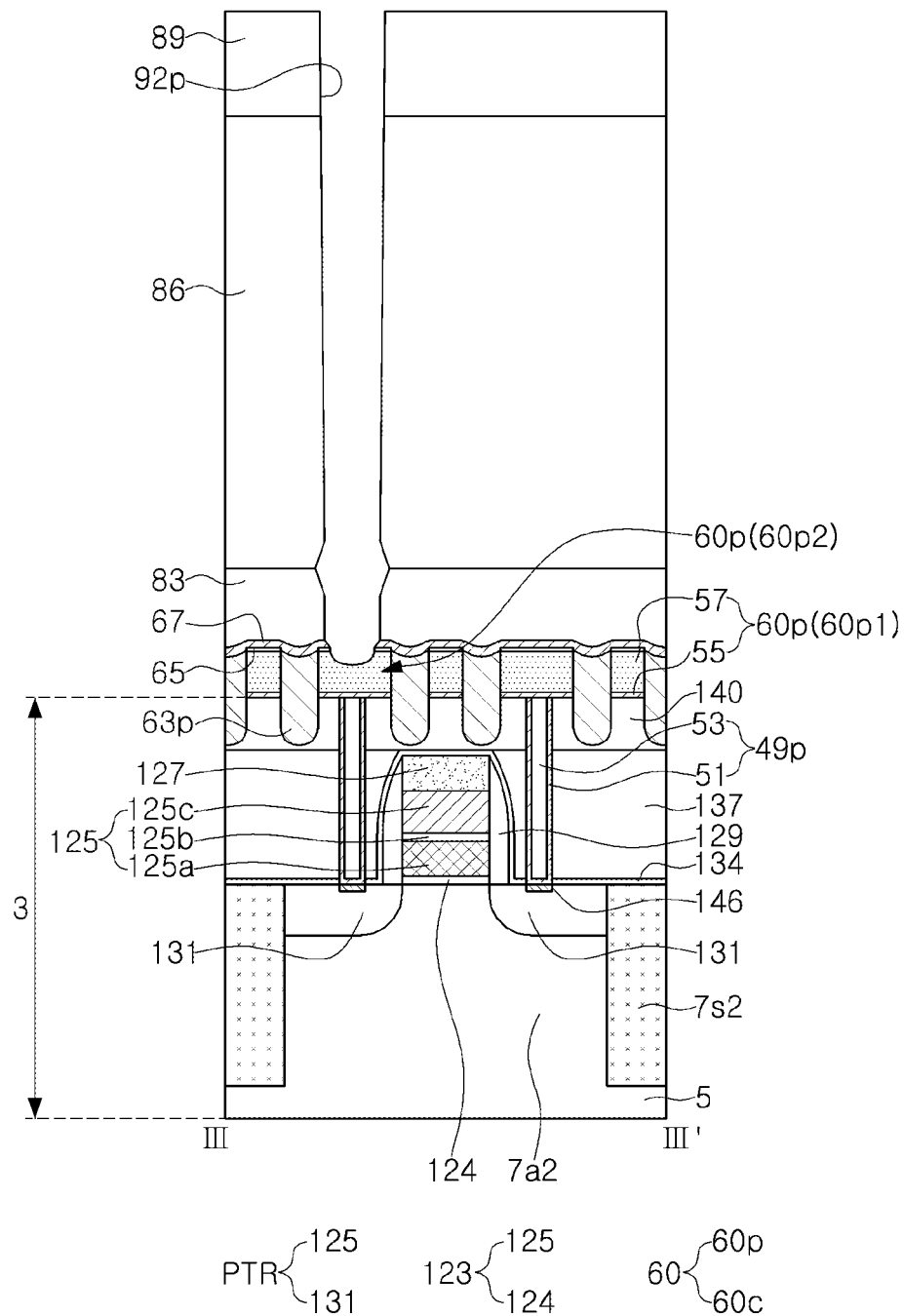

Referring to FIGS. 14A and 14B, the insulating structures 83, 76, and 89 may be formed (S35). The third insulating layer 89 covering the plate electrode 79 and the second insulating layer 86 may be formed. The first insulating layer 83, the second insulating layer 86, and the third insulating layer 89 may form the insulating structures 83, 76, and 89.

A cell contact hole 92c penetrating through the insulating structures 83, 76 and 89 and exposing the plate electrode 79 of the cell capacitors may be formed, and at the same time, a peripheral contact hole 92p penetrating through the insulating structures 83, 76 and 89 and the insulating etch stop layer 67 and exposing a pad pattern 60p2 among the conductive patterns 60 may be formed (S40). The pad pattern 60p2 may be a pad pattern of the second conductive pattern 60p among the conductive patterns 60.

Again, referring to FIGS. 1 to 3, the cell contact plug 96c and the peripheral contact plug 96p may be formed in the cell contact hole 92c and the peripheral contact hole 92p, respectively (S45).

In an example embodiment, the first insulating layer 83 may be formed of an oxide having a lower etching rate than the second insulating layer 86. To form the peripheral contact hole 92p, forming the peripheral contact hole 92p may include etching the third insulating layer 89 and the second insulating layer 86 at a relatively high rate to expose the first insulating layer 83, etching the first insulating layer 83 having a relatively low etch rate to expose the insulating etch stop layer 67, etching the exposed insulating etch stop layer 67, and subsequently, performing etching up to the inside of the second conductive pattern 60p. Due to the difference in etching rates between the first and second insulating layers 83 and 86, and the insulating etch stop layer 67, the sidewall profile of the peripheral contact hole 92p may be formed to have the same shape as the side profile of the peripheral contact plug 96p described with reference to FIGS. 2B and 3.

According to an example embodiment, by forming the first and second insulating layers 83 and 86 with different etching rates, the thickness of the insulating etch stop layer 67 may be formed relatively thinner, and the peripheral contact hole 92p may also be formed without defects. Accordingly, the peripheral contact hole 92p may be formed without defects while forming the insulating etch stop layer 67 to have a thickness of about 100 Å or less, e.g., a thickness in a range of about 40 Å to about 70 Å.

By forming the insulating etch stop layer 67 to have a thickness of about 100 Å or less, a defect in which the first conductive patterns 60c are not opened may be prevented in the process of forming storage node contact holes penetrating through the mold structure and the insulating etch stop layer 67 and exposing the first conductive patterns 60c as described with reference to FIGS. 10, 11B and 12, and in the process of forming the first capacitor electrodes 70 filling the storage node contact holes. Accordingly, by forming the insulating etch stop layer 67 to a thickness of about 100 Å or less, the first capacitor electrodes 70 may be reliably formed without defects.

By way of summation and review, example embodiments provide a semiconductor device including a contact plug and a method of manufacturing the same. That is, as set forth above, a semiconductor device including an insulating etch stop layer having a reduced thickness and a reliable contact plug, and a method of forming the same are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure having a first area and a second area;
conductive patterns including first conductive patterns and a second conductive pattern, the first conductive patterns being on the first area of the lower structure, and the second conductive pattern being on the second area of the lower structure;
an insulating pattern between the conductive patterns;
an insulating etch stop layer on the conductive patterns and the insulating pattern;
a capacitor on the first area, the capacitor including:
first capacitor electrodes in contact with the first conductive patterns and extending upwardly through the insulating etch stop layer,
a second capacitor electrode on the first capacitor electrodes, and
a capacitor dielectric between the first capacitor electrodes and the second capacitor electrode;
an insulating structure covering the capacitor, on the first area, and covering the insulating etch stop layer, on the second area; and
a peripheral contact plug on the second area and penetrating through the insulating structure and the insulating etch stop layer, the peripheral contact plug contacting the second conductive pattern, and the peripheral contact plug including:
a first plug region in contact with the second conductive pattern and extending into the second conductive pattern,
a second plug region penetrating through the insulating etch stop layer, on the first plug region,
a third plug region including a first side surface, on the second plug region, the first side surface having a first inclination,
a fourth plug region including a second side surface, on the third plug region, and
a fifth plug region including a third side surface, on the fourth plug region, the third side surface having a second inclination,
wherein at least a portion of the second side surface has an inclination different from the first inclination and the second inclination, and
wherein a vertical thickness of the fifth plug region is at least twice as great as a sum of vertical thicknesses of the first to fourth plug regions.

2. The semiconductor device as claimed in claim 1, wherein:
the fourth plug region includes a lower region and an upper region on the lower region,
the lower region has a lower side inclined to increase in width in an upper direction,
the upper region has an upper side inclined to decrease in width in the upper direction, and
the upper direction is a direction from the lower region toward the upper region.

3. The semiconductor device as claimed in claim 2, wherein, in the fourth plug region, a vertical thickness of the lower region is substantially the same as a vertical thickness of the upper region.

4. The semiconductor device as claimed in claim 2, wherein, in the fourth plug region, a vertical thickness of the lower region is greater than a vertical thickness of the upper region.

5. The semiconductor device as claimed in claim 2, wherein a minimum width of the upper region is greater than a minimum width of the lower region.

6. The semiconductor device as claimed in claim 2, wherein the fourth plug region includes a sharp cusp at a boundary between a side surface of the lower region and a side surface of the upper region.

7. The semiconductor device as claimed in claim 2, wherein the fourth plug region includes a curved surface at a boundary between a side surface of the lower region and a side surface of the upper region.

8. The semiconductor device as claimed in claim 1, wherein a lower width of the second plug region is less than an upper width of the second plug region.

9. The semiconductor device as claimed in claim 1, wherein a maximum width of the first plug region is less than a minimum width of the third plug region.

10. The semiconductor device as claimed in claim 1, wherein a maximum width of the fourth plug region is greater than a width of the third plug region adjacent to the fourth plug region.

11. The semiconductor device as claimed in claim 1, wherein a maximum width of the fourth plug region is greater than a width of the fifth plug region adjacent to the fourth plug region.

12. The semiconductor device as claimed in claim 1, wherein:
a minimum width of the fifth plug region is greater than a maximum width of the third plug region, and
a maximum width of the fourth plug region is greater than the minimum width of the fifth plug region and the maximum width of the third plug region.

13. The semiconductor device as claimed in claim 1, further comprising a capacitor contact plug through the insulating structure on the capacitor and in contact with the second capacitor electrode, on the first area,
wherein each of the capacitor contact plug and the peripheral contact plug includes a conductive plug and a conductive liner covering a side surface and a bottom surface of the conductive plug.

14. The semiconductor device as claimed in claim 1, further comprising:
a first support in contact with the first capacitor electrodes; and a second support in contact with the first capacitor electrodes, the second support being at a level higher than the first support,
wherein the fourth plug region is at a level lower than a level of the first support.

15. The semiconductor device as claimed in claim 1, wherein the lower structure includes:
a cell transistor and a bit line in the first area, and
a peripheral transistor in the second area.

16. The semiconductor device as claimed in claim 1, wherein the insulating etch stop layer includes a SiBN material or a SiCN material, a thickness of the insulating etch stop layer being in a range of about 40 angstroms to about 70 angstroms.

17. A semiconductor device, comprising:
a lower structure including a transistor;
a conductive pattern on the lower structure;
an insulating pattern covering a side surface of the conductive pattern;
an insulating etch stop layer on the conductive pattern and the insulating pattern;
an insulating structure on the insulating etch stop layer; and
a contact plug through the insulating structure and the insulating etch stop layer, the contact plug contacting the conductive pattern, and the contact plug including:
a first plug region in contact with the conductive pattern,
a second plug region through the insulating etch stop layer, on the first plug region,
a third plug region including a first side surface, on the second plug region,
a fourth plug region including a second side surface, on the third plug region, the fourth plug region having a lower region increasing in width in an upper direction and an upper region decreasing in width in the upper direction, on the lower region, and the upper direction being a direction from the lower region toward the upper region, and
a fifth plug region including a third side surface, on the fourth plug region, a vertical thickness of the fifth plug region being at least twice as great as a sum of vertical thicknesses of the first to fourth plug regions.

18. The semiconductor device as claimed in claim 17, wherein:
a maximum width of the first plug region is less than a minimum width of the third plug region,
a maximum width of the third plug region is less than a maximum width of the fourth plug region, and
the maximum width of the fourth plug region is greater than a width of the third plug region adjacent to the fourth plug region and a width of the fifth plug region adjacent to the fourth plug region.

19. A semiconductor device, comprising:
a lower structure including a transistor;
a conductive pattern on the lower structure;
an insulating pattern covering a side surface of the conductive pattern;
an insulating etch stop layer on the conductive pattern and the insulating pattern;
an insulating structure on the insulating etch stop layer; and
a contact plug through the insulating structure and the insulating etch stop layer, the contact plug contacting the conductive pattern, and the contact plug including:
a first plug region in contact with the conductive pattern,
a second plug region through the insulating etch stop layer, on the first plug region,
a third plug region including a first side surface, on the second plug region,
a fourth plug region including a second side surface, on the third plug region, and
a fifth plug region including a third side surface, on the fourth plug region, a vertical thickness of the fifth plug region being at least twice as great as a sum of vertical thicknesses of the first to fourth plug regions,
wherein the first side surface of the third plug region adjacent to the fourth plug region has a first inclination,
wherein the third side surface of the fifth plug region adjacent to the fourth plug region has a second inclination, and
wherein at least a portion of the second side surface of the fourth plug region has an inclination different from the first inclination and the second inclination.

20. The semiconductor device as claimed in claim 19, further comprising an oxide layer on the conductive pattern, the oxide layer being between the insulating etch stop layer and an upper surface of the conductive pattern,
wherein the contact plug extends through the oxide layer and contacts the conductive pattern,
wherein the insulating etch stop layer includes a material different from the oxide layer and the insulating structure, and
wherein a thickness of the insulating etch stop layer is in a range of about 40 Å to about 70 Å.

* * * * *